(12) United States Patent
Manssen et al.

(10) Patent No.: US 9,608,591 B2
(45) Date of Patent: Mar. 28, 2017

(54) METHOD AND APPARATUS FOR ADAPTING A VARIABLE IMPEDANCE NETWORK

(71) Applicant: BlackBerry Limited, Waterloo (CA)

(72) Inventors: Keith Manssen, Crystal Lake, IL (US); Matthew Russell Greene, Waterloo (CA)

(73) Assignee: BlackBerry Limited, Waterloo, ON (CA)

( * ) Notice: Subject to any disclaimer, the term of this patent is extended or adjusted under 35 U.S.C. 154(b) by 232 days.

(21) Appl. No.: 14/332,451

(22) Filed: Jul. 16, 2014

(65) Prior Publication Data

US 2014/0327493 A1 Nov. 6, 2014

Related U.S. Application Data

(63) Continuation of application No. 12/729,221, filed on Mar. 22, 2010, now Pat. No. 8,803,631.

(51) Int. Cl.
*H03H 7/38* (2006.01)
*H03H 5/12* (2006.01)
*H03H 7/00* (2006.01)

(52) U.S. Cl.
CPC ............. *H03H 7/38* (2013.01); *H03H 5/12* (2013.01); *H03H 7/004* (2013.01)

(58) Field of Classification Search
CPC .................... H03H 7/38; H03H 7/40
USPC .................................. 333/17.3, 32
See application file for complete search history.

(56) References Cited

U.S. PATENT DOCUMENTS

| | | | |
|---|---|---|---|
| 2,745,067 A | 5/1956 | True |
| 3,117,279 A | 1/1964 | Ludvigson |
| 3,160,832 A | 12/1964 | Beitman |
| 3,390,337 A | 6/1968 | Beitman |
| 3,443,231 A | 5/1969 | Roza |
| 3,509,500 A | 4/1970 | McNair |

(Continued)

FOREIGN PATENT DOCUMENTS

| | | |
|---|---|---|
| CN | 101640949 A | 2/2010 |
| CN | 201765685 U | 3/2011 |

(Continued)

OTHER PUBLICATIONS

Payandehjoo, Kasra et al., "Investigation of Parasitic Elements for Coupling Reduction in MultiAntenna Hand-Set Devices", Published online Jan. 22, 2013 in Wiley Online Library (wileyonlinelibrary.com).

(Continued)

*Primary Examiner* — Stephen E Jones
(74) *Attorney, Agent, or Firm* — Guntin & Gust, PLC; Jay H. Anderson

(57) ABSTRACT

The present disclosure may include, for example, a tunable capacitor having a decoder for generating a plurality of control signals, and an array of tunable switched capacitors comprising a plurality of fixed capacitors coupled to a plurality of switches. The plurality of switches can be controlled by the plurality of control signals to manage a tunable range of reactance of the array of tunable switched capacitors. Additionally, the array of tunable switched capacitors is adapted to have non-uniform quality (Q) factors. Additional embodiments are disclosed.

20 Claims, 9 Drawing Sheets

Allows substrate to not connect to $S_5/C_5$ in order to reduce off capacitance

(56) References Cited

U.S. PATENT DOCUMENTS

| | | |
|---|---|---|
| 3,571,716 A | 3/1971 | Hill |
| 3,590,385 A | 6/1971 | Sabo |
| 3,601,717 A | 8/1971 | Kuecken |
| 3,742,279 A | 6/1973 | Kupsky |
| 3,749,491 A | 7/1973 | Maxfield et al. |
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta |
| 4,227,256 A | 10/1980 | O'Keefe |
| 4,383,441 A | 5/1983 | Willis |
| 4,476,578 A | 10/1984 | Gaudin |
| 4,493,112 A | 1/1985 | Bruene |
| 4,509,019 A | 4/1985 | Banu et al. |
| 4,777,490 A | 10/1988 | Sharma |
| 4,799,066 A | 1/1989 | Deacon |
| 4,965,607 A | 10/1990 | Wilkins |
| 4,970,478 A | 11/1990 | Townley et al. |
| 4,980,656 A | 12/1990 | Duffalo |
| 5,032,805 A | 7/1991 | Elmer |
| 5,136,478 A | 8/1992 | Bruder |
| 5,142,255 A | 8/1992 | Chang |
| 5,177,670 A | 1/1993 | Shinohara |
| 5,195,045 A | 3/1993 | Keane |
| 5,200,826 A | 4/1993 | Seong |
| 5,212,463 A | 5/1993 | Babbitt |
| 5,216,392 A | 6/1993 | Fraser et al. |
| 5,230,091 A | 7/1993 | Vaisanen et al. |
| 5,243,358 A | 9/1993 | Sanford |
| 5,258,728 A | 11/1993 | Taniyoshi |
| 5,276,912 A | 1/1994 | Siwiak |
| 5,301,358 A | 4/1994 | Gaskill |
| 5,307,033 A | 4/1994 | Koscica |
| 5,310,358 A | 5/1994 | Johnson |
| 5,312,790 A | 5/1994 | Sengupta |
| 5,334,958 A | 8/1994 | Babbitt |
| 5,361,403 A | 11/1994 | Dent |
| 5,371,473 A | 12/1994 | Trinh |
| 5,409,889 A | 4/1995 | Das |
| 5,427,988 A | 6/1995 | Sengupta |
| 5,430,417 A | 7/1995 | Martin |
| 5,446,447 A | 8/1995 | Carney |
| 5,448,252 A | 9/1995 | Ali |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A | 6/1996 | Bradley |
| 5,548,837 A | 8/1996 | Hess et al. |
| 5,561,407 A | 10/1996 | Koscica |
| 5,564,086 A | 10/1996 | Cygan |
| 5,583,359 A | 12/1996 | Ng et al. |
| 5,589,844 A | 12/1996 | Belcher et al. |
| 5,593,495 A | 1/1997 | Masuda |
| 5,635,433 A | 6/1997 | Sengupta |
| 5,635,434 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,721,194 A | 2/1998 | Yandrofski |
| 5,766,697 A | 6/1998 | Sengupta |
| 5,777,581 A | 7/1998 | Lilly |
| 5,778,308 A | 7/1998 | Sroka |
| 5,786,727 A | 7/1998 | Sigmon |
| 5,812,572 A | 9/1998 | King |
| 5,812,943 A | 9/1998 | Suzuki |
| 5,830,591 A | 11/1998 | Sengupta |
| 5,846,893 A | 12/1998 | Sengupta |
| 5,874,926 A | 2/1999 | Tsuru |
| 5,880,635 A | 3/1999 | Satoh |
| 5,886,867 A | 3/1999 | Chivukula |
| 5,892,482 A | 4/1999 | Coleman et al. |
| 5,926,751 A | 7/1999 | Vlahos et al. |
| 5,929,717 A | 7/1999 | Richardson |
| 5,940,030 A | 8/1999 | Hampel et al. |
| 5,963,871 A | 10/1999 | Zhinong |
| 5,969,582 A | 10/1999 | Boesch |
| 5,982,099 A | 11/1999 | Barnes et al. |
| 5,990,766 A | 11/1999 | Zhang |
| 6,009,124 A | 12/1999 | Smith |
| 6,020,787 A | 2/2000 | Kim |
| 6,020,795 A | 2/2000 | Kim |
| 6,029,075 A | 2/2000 | Das |
| 6,045,932 A | 4/2000 | Jia |
| 6,061,025 A | 5/2000 | Jackson |
| 6,064,865 A | 5/2000 | Kuo et al. |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand |
| 6,115,585 A | 9/2000 | Matero |
| 6,125,266 A | 9/2000 | Matero et al. |
| 6,133,883 A | 10/2000 | Munson |
| 6,172,385 B1 | 1/2001 | Duncombe |
| 6,215,644 B1 | 4/2001 | Dhuler |
| 6,242,989 B1 | 6/2001 | Barber |
| 6,266,528 B1 | 7/2001 | Farzaneh |
| 6,281,748 B1 | 8/2001 | Klomsdorf et al. |
| 6,281,847 B1 | 8/2001 | Lee |
| 6,309,895 B1 | 10/2001 | Jaing |
| 6,343,208 B1 | 1/2002 | Ying |
| 6,377,142 B1 | 4/2002 | Chiu |
| 6,377,217 B1 | 4/2002 | Zhu |
| 6,377,440 B1 | 4/2002 | Zhu |
| 6,384,785 B1 | 5/2002 | Kamogawa |
| 6,404,614 B1 | 6/2002 | Zhu |
| 6,408,190 B1 | 6/2002 | Ying |
| 6,414,562 B1 | 7/2002 | Bouisse |
| 6,415,562 B1 | 7/2002 | Donaghue |
| 6,452,776 B1 | 9/2002 | Chakravorty |
| 6,461,930 B2 | 10/2002 | Akram |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu |
| 6,535,076 B2 | 3/2003 | Partridge |
| 6,535,722 B1 | 3/2003 | Rosen |
| 6,538,603 B1 | 3/2003 | Chen |
| 6,556,102 B1 | 4/2003 | Sengupta |
| 6,556,814 B1 | 4/2003 | Klomsdorf |
| 6,570,462 B2 | 5/2003 | Edmonson |
| 6,590,468 B2 | 7/2003 | du Toit |
| 6,590,541 B1 | 7/2003 | Schultze |
| 6,597,265 B2 | 7/2003 | Liang |
| 6,608,603 B2 | 8/2003 | Alexopoulos |
| 6,624,786 B2 | 9/2003 | Boyle |
| 6,640,085 B1 | 10/2003 | Chatzipetros |
| 6,657,595 B1 | 12/2003 | Phillips |
| 6,661,638 B2 | 12/2003 | Jackson |
| 6,670,256 B2 | 12/2003 | Yang |
| 6,710,651 B2 | 3/2004 | Forrester |
| 6,724,611 B1 | 4/2004 | Mosley |
| 6,724,890 B1 | 4/2004 | Bareis |
| 6,737,179 B2 | 5/2004 | Sengupta |
| 6,747,522 B2 | 6/2004 | Pietruszynski et al. |
| 6,759,918 B2 | 7/2004 | du Toit |
| 6,765,540 B2 | 7/2004 | Toncich |
| 6,768,472 B2 | 7/2004 | Alexopoulos |
| 6,774,077 B2 | 8/2004 | Sengupta |
| 6,795,712 B1 | 9/2004 | Vakilian |
| 6,825,818 B2 | 11/2004 | Toncich |
| 6,839,028 B2 | 1/2005 | Lee |
| 6,845,126 B2 | 1/2005 | Dent |
| 6,859,104 B2 | 2/2005 | Toncich |

(56) References Cited

U.S. PATENT DOCUMENTS

| | | |
|---|---|---|
| 6,862,432 B1 | 3/2005 | Kim |
| 6,864,757 B2 | 3/2005 | Du Toit |
| 6,868,260 B2 | 3/2005 | Jagielski |
| 6,875,655 B2 | 4/2005 | Lin |
| 6,882,245 B2 | 4/2005 | Utsunomiya |
| 6,888,714 B2 | 5/2005 | Shaw |
| 6,905,989 B2 | 6/2005 | Ellis |
| 6,906,653 B2 | 6/2005 | Uno |
| 6,907,234 B2 | 6/2005 | Karr |
| 6,914,487 B1 | 7/2005 | Doyle et al. |
| 6,920,315 B1 | 7/2005 | Wilcox et al. |
| 6,922,330 B2 | 7/2005 | Nielsen |
| 6,943,078 B1 | 9/2005 | Zheng |
| 6,946,847 B2 | 9/2005 | Nishimori |
| 6,949,442 B2 | 9/2005 | Barth |
| 6,961,368 B2 | 11/2005 | Dent |
| 6,964,296 B2 | 11/2005 | Memory |
| 6,965,837 B2 | 11/2005 | Vintola |
| 6,987,493 B2 | 1/2006 | Chen |
| 6,993,297 B2 | 1/2006 | Smith |
| 6,999,297 B1 | 2/2006 | Klee |
| 7,009,455 B2 | 3/2006 | Toncich |
| 7,071,776 B2 | 7/2006 | Forrester |
| 7,106,715 B1 | 9/2006 | Kelton |
| 7,107,033 B2 | 9/2006 | du Toit |
| 7,113,614 B2 | 9/2006 | Rhoads |
| 7,151,411 B2 | 12/2006 | Martin |
| 7,176,634 B2 | 2/2007 | Kitamura |
| 7,176,845 B2 | 2/2007 | Fabrega-Sanchez |
| 7,180,467 B2 | 2/2007 | Fabrega-Sanchez |
| 7,221,327 B2 | 5/2007 | Toncich |
| 7,298,329 B2 | 11/2007 | Diament |
| 7,299,018 B2 | 11/2007 | Van Rumpt |
| 7,312,118 B2 | 12/2007 | Kiyotoshi |
| 7,332,980 B2 | 2/2008 | Zhu |
| 7,332,981 B2 | 2/2008 | Matsuno |
| 7,339,527 B2 | 3/2008 | Sager |
| 7,369,828 B2 | 5/2008 | Shamsaifar |
| 7,426,373 B2 | 9/2008 | Clingman |
| 7,427,949 B2 | 9/2008 | Channabasappa et al. |
| 7,453,405 B2 | 11/2008 | Nishikido et al. |
| 7,468,638 B1 | 12/2008 | Tsai |
| 7,469,129 B2 | 12/2008 | Blaker et al. |
| 7,528,674 B2 | 5/2009 | Kato et al. |
| 7,531,011 B2 | 5/2009 | Yamasaki |
| 7,535,080 B2 | 5/2009 | Zeng et al. |
| 7,535,312 B2 | 5/2009 | McKinzie |
| 7,539,527 B2 | 5/2009 | Jang |
| 7,557,507 B2 | 7/2009 | Wu |
| 7,596,357 B2 | 9/2009 | Nakamata |
| 7,633,355 B2 | 12/2009 | Matsuo |
| 7,642,879 B2 | 1/2010 | Matsuno |
| 7,655,530 B2 | 2/2010 | Hosking |
| 7,667,663 B2 | 2/2010 | Hsiao |
| 7,671,693 B2 | 3/2010 | Brobston et al. |
| 7,705,692 B2 | 4/2010 | Fukamachi et al. |
| 7,711,337 B2 | 5/2010 | McKinzie |
| 7,714,676 B2 | 5/2010 | McKinzie |
| 7,714,678 B2 | 5/2010 | du Toit et al. |
| 7,728,693 B2 | 6/2010 | du Toit et al. |
| 7,760,699 B1 | 7/2010 | Malik |
| 7,768,400 B2 | 8/2010 | Lawrence et al. |
| 7,786,819 B2 | 8/2010 | Ella |
| 7,795,990 B2 | 9/2010 | du Toit |
| 7,852,170 B2 | 12/2010 | McKinzie |
| 7,856,228 B2 | 12/2010 | Lekutai et al. |
| 7,865,154 B2 | 1/2011 | Mendolia |
| 7,907,094 B2 | 3/2011 | Kakitsu et al. |
| 7,917,104 B2 | 3/2011 | Manssen et al. |
| 7,949,309 B2 | 5/2011 | Rofougaran |
| 7,969,257 B2 | 6/2011 | du Toit |
| 7,983,615 B2 | 7/2011 | Bryce et al. |
| 7,991,363 B2 | 8/2011 | Greene |
| 8,008,982 B2 | 8/2011 | McKinzie |
| 8,072,285 B2 | 12/2011 | Spears |
| 8,112,043 B2 | 2/2012 | Knudsen et al. |
| 8,170,510 B2 | 5/2012 | Knudsen et al. |
| 8,190,109 B2 | 5/2012 | Ali et al. |
| 8,204,446 B2 | 6/2012 | Scheer |
| 8,213,886 B2 | 7/2012 | Blin |
| 8,217,731 B2 | 7/2012 | McKinzie et al. |
| 8,217,732 B2 | 7/2012 | McKinzie |
| 8,299,867 B2 | 10/2012 | McKinzie |
| 8,320,850 B1 | 11/2012 | Khlat |
| 8,325,097 B2 | 12/2012 | McKinzie, III et al. |
| 8,405,563 B2 | 3/2013 | McKinzie et al. |
| 8,421,548 B2 | 4/2013 | Spears et al. |
| 8,432,234 B2 | 4/2013 | Manssen et al. |
| 8,442,457 B2 | 5/2013 | Harel et al. |
| 8,457,569 B2 | 6/2013 | Blin |
| 8,472,888 B2 | 6/2013 | Manssen et al. |
| 8,558,633 B2 | 10/2013 | McKinzie, III |
| 8,564,381 B2 | 10/2013 | McKinzie |
| 8,594,584 B2 | 11/2013 | Greene et al. |
| 8,620,236 B2 | 12/2013 | Manssen et al. |
| 8,620,246 B2 | 12/2013 | McKinzie et al. |
| 8,620,247 B2 | 12/2013 | McKinzie et al. |
| 8,655,286 B2 | 2/2014 | Mendolia |
| 8,674,783 B2 | 3/2014 | Spears et al. |
| 8,680,934 B2 | 3/2014 | McKinzie et al. |
| 8,693,963 B2 | 4/2014 | du Toit et al. |
| 8,712,340 B2 | 4/2014 | Hoirup et al. |
| 8,787,845 B2 | 7/2014 | Manssen et al. |
| 8,803,631 B2 * | 8/2014 | Manssen .............. H03H 5/12 333/32 |
| 8,860,525 B2 | 10/2014 | Spears et al. |
| 8,948,889 B2 | 2/2015 | Spears et al. |
| 8,957,742 B2 | 2/2015 | Spears et al. |
| 9,026,062 B2 | 5/2015 | Greene et al. |
| 9,119,152 B2 | 8/2015 | Blin |
| 2002/0008672 A1 | 1/2002 | Gothard et al. |
| 2002/0030566 A1 | 3/2002 | Bozler |
| 2002/0079982 A1 | 6/2002 | Lafleur et al. |
| 2002/0109642 A1 | 8/2002 | Gee et al. |
| 2002/0118075 A1 | 8/2002 | Ohwada |
| 2002/0145483 A1 | 10/2002 | Bouisse |
| 2002/0167963 A1 | 11/2002 | Joa-Ng |
| 2002/0183013 A1 | 12/2002 | Auckland et al. |
| 2002/0187780 A1 | 12/2002 | Souissi |
| 2002/0191703 A1 | 12/2002 | Ling |
| 2002/0193088 A1 | 12/2002 | Jung |
| 2003/0060227 A1 | 3/2003 | Sekine |
| 2003/0071300 A1 | 4/2003 | Yashima |
| 2003/0114124 A1 | 6/2003 | Higuchi |
| 2003/0142022 A1 | 7/2003 | Ollikainen |
| 2003/0184319 A1 | 10/2003 | Nishimori et al. |
| 2003/0193997 A1 | 10/2003 | Dent |
| 2003/0199286 A1 | 10/2003 | D du Toit |
| 2003/0210206 A1 | 11/2003 | Phillips |
| 2003/0216150 A1 | 11/2003 | Ueda |
| 2003/0232607 A1 | 12/2003 | Le Bars |
| 2004/0009754 A1 | 1/2004 | Smith |
| 2004/0090372 A1 | 5/2004 | Nallo |
| 2004/0100341 A1 | 5/2004 | Luetzelschwab |
| 2004/0127178 A1 | 7/2004 | Kuffner |
| 2004/0137950 A1 | 7/2004 | Bolin |
| 2004/0202399 A1 | 10/2004 | Kochergin |
| 2004/0204027 A1 | 10/2004 | Park et al. |
| 2004/0227176 A1 | 11/2004 | York |
| 2004/0232982 A1 | 11/2004 | Itchitsubo et al. |
| 2004/0257293 A1 | 12/2004 | Friedrich |
| 2004/0263411 A1 | 12/2004 | Fabrega-Sanchez et al. |
| 2005/0007291 A1 | 1/2005 | Fabrega-Sanchez |
| 2005/0032488 A1 | 2/2005 | Pehlke |
| 2005/0032541 A1 | 2/2005 | Wang |
| 2005/0042994 A1 | 2/2005 | Otaka |
| 2005/0059362 A1 | 3/2005 | Kalajo et al. |
| 2005/0082636 A1 | 4/2005 | Yashima |
| 2005/0085204 A1 | 4/2005 | Poilasne et al. |
| 2005/0093624 A1 | 5/2005 | Forrester et al. |
| 2005/0130608 A1 | 6/2005 | Forse |
| 2005/0130699 A1 | 6/2005 | Kim |
| 2005/0208960 A1 | 9/2005 | Hassan |
| 2005/0215204 A1 | 9/2005 | Wallace |

(56) References Cited

U.S. PATENT DOCUMENTS

| | | |
|---|---|---|
| 2005/0227633 A1 | 10/2005 | Dunko |
| 2005/0259011 A1 | 11/2005 | Vance |
| 2005/0264455 A1 | 12/2005 | Talvitie |
| 2005/0280588 A1 | 12/2005 | Fujikawa et al. |
| 2005/0282503 A1 | 12/2005 | Onno |
| 2006/0003537 A1 | 1/2006 | Sinha |
| 2006/0009165 A1 | 1/2006 | Alles |
| 2006/0077082 A1 | 4/2006 | Shanks et al. |
| 2006/0099915 A1 | 5/2006 | Laroia et al. |
| 2006/0099952 A1 | 5/2006 | Prehofer et al. |
| 2006/0119511 A1 | 6/2006 | Collinson et al. |
| 2006/0148415 A1 | 7/2006 | Hamalainen et al. |
| 2006/0160501 A1 | 7/2006 | Mendolia |
| 2006/0183431 A1 | 8/2006 | Chang et al. |
| 2006/0183433 A1 | 8/2006 | Mori et al. |
| 2006/0183442 A1 | 8/2006 | Chang et al. |
| 2006/0195161 A1 | 8/2006 | Li et al. |
| 2006/0205368 A1 | 9/2006 | Bustamante |
| 2006/0281423 A1 | 12/2006 | Caimi |
| 2007/0001924 A1 | 1/2007 | Hirabayashi et al. |
| 2007/0013483 A1 | 1/2007 | Stewart |
| 2007/0035458 A1 | 2/2007 | Ohba |
| 2007/0042725 A1 | 2/2007 | Poilasne |
| 2007/0042734 A1 | 2/2007 | Ryu |
| 2007/0063788 A1 | 3/2007 | Zhu |
| 2007/0080888 A1 | 4/2007 | Mohamadi |
| 2007/0082611 A1 | 4/2007 | Terranova et al. |
| 2007/0085609 A1 | 4/2007 | Itkin et al. |
| 2007/0091006 A1 | 4/2007 | Thober et al. |
| 2007/0111681 A1 | 5/2007 | Alberth et al. |
| 2007/0121267 A1 | 5/2007 | Kotani et al. |
| 2007/0142011 A1 | 6/2007 | Shatara |
| 2007/0142014 A1 | 6/2007 | Wilcox |
| 2007/0149146 A1 | 6/2007 | Hwang |
| 2007/0171879 A1 | 7/2007 | Bourque |
| 2007/0182636 A1 | 8/2007 | Carlson |
| 2007/0184825 A1 | 8/2007 | Lim et al. |
| 2007/0194859 A1 | 8/2007 | Brobston |
| 2007/0197180 A1 | 8/2007 | McKinzie et al. |
| 2007/0200766 A1 | 8/2007 | McKinzie |
| 2007/0200773 A1 | 8/2007 | Dou et al. |
| 2007/0248238 A1 | 10/2007 | Abreu et al. |
| 2007/0285326 A1 | 12/2007 | McKinzie |
| 2007/0293176 A1 | 12/2007 | Yu |
| 2008/0007478 A1 | 1/2008 | Jung |
| 2008/0018541 A1 | 1/2008 | Pang |
| 2008/0030165 A1 | 2/2008 | Lisac et al. |
| 2008/0055016 A1 | 3/2008 | Morris |
| 2008/0055168 A1 | 3/2008 | Massey et al. |
| 2008/0081670 A1 | 4/2008 | Rofougaran |
| 2008/0090539 A1 | 4/2008 | Thompson |
| 2008/0094149 A1 | 4/2008 | Brobston |
| 2008/0106350 A1 | 5/2008 | McKinzie |
| 2008/0122553 A1 | 5/2008 | McKinzie |
| 2008/0122723 A1 | 5/2008 | Rofougaran |
| 2008/0129612 A1 | 6/2008 | Wang |
| 2008/0158076 A1 | 7/2008 | Walley |
| 2008/0174508 A1 | 7/2008 | Iwai et al. |
| 2008/0261544 A1 | 10/2008 | Blin et al. |
| 2008/0274706 A1 | 11/2008 | Blin et al. |
| 2008/0280570 A1 | 11/2008 | Blin |
| 2008/0285729 A1 | 11/2008 | Glasgow et al. |
| 2008/0288028 A1 | 11/2008 | Larson et al. |
| 2008/0294718 A1 | 11/2008 | Okano |
| 2008/0300027 A1 | 12/2008 | Dou et al. |
| 2008/0305749 A1 | 12/2008 | Ben-Bassat |
| 2008/0305750 A1 | 12/2008 | Alon et al. |
| 2008/0309617 A1 | 12/2008 | Kong et al. |
| 2009/0002077 A1 | 1/2009 | Rohani et al. |
| 2009/0027286 A1 | 1/2009 | Ohishi |
| 2009/0039976 A1 | 2/2009 | McKinzie, III |
| 2009/0051611 A1 | 2/2009 | Shamblin et al. |
| 2009/0082017 A1 | 3/2009 | Chang et al. |
| 2009/0109880 A1 | 4/2009 | Kim et al. |
| 2009/0121963 A1 | 5/2009 | Greene |
| 2009/0149136 A1 | 6/2009 | Rofougaran |
| 2009/0180403 A1 | 7/2009 | Tudosoiu |
| 2009/0184879 A1 | 7/2009 | Derneryd |
| 2009/0215446 A1 | 8/2009 | Hapsari et al. |
| 2009/0231220 A1 | 9/2009 | Zhang et al. |
| 2009/0253385 A1 | 10/2009 | Dent et al. |
| 2009/0264065 A1 | 10/2009 | Song |
| 2009/0278685 A1 | 11/2009 | Potyrailo |
| 2009/0295651 A1 | 12/2009 | Dou et al. |
| 2009/0323572 A1 | 12/2009 | Shi et al. |
| 2009/0323582 A1 | 12/2009 | Proctor et al. |
| 2010/0041348 A1 | 2/2010 | Wilcox et al. |
| 2010/0053009 A1 | 3/2010 | Rofougaran |
| 2010/0060531 A1 | 3/2010 | Rappaport |
| 2010/0073103 A1 | 3/2010 | Spears et al. |
| 2010/0085260 A1 | 4/2010 | McKinzie |
| 2010/0085884 A1 | 4/2010 | Srinivasan et al. |
| 2010/0105425 A1 | 4/2010 | Asokan |
| 2010/0107067 A1 | 4/2010 | Vaisanen et al. |
| 2010/0134215 A1 | 6/2010 | Lee et al. |
| 2010/0156552 A1 | 6/2010 | McKinzie |
| 2010/0164640 A1 | 7/2010 | McKinzie |
| 2010/0164641 A1 | 7/2010 | McKinzie |
| 2010/0214189 A1 | 8/2010 | Kanazawa |
| 2010/0232474 A1 | 9/2010 | Rofougaran |
| 2010/0244576 A1 | 9/2010 | Hillan et al. |
| 2010/0277363 A1 | 11/2010 | Kainulainen et al. |
| 2010/0285836 A1 | 11/2010 | Horihata et al. |
| 2010/0302106 A1 | 12/2010 | Knudsen et al. |
| 2010/0304688 A1 | 12/2010 | Knudsen |
| 2011/0002080 A1 | 1/2011 | Ranta |
| 2011/0012790 A1 | 1/2011 | Badaruzzaman |
| 2011/0014879 A1 | 1/2011 | Alberth et al. |
| 2011/0014886 A1 | 1/2011 | Manssen |
| 2011/0039504 A1 | 2/2011 | Nguyen et al. |
| 2011/0043298 A1 | 2/2011 | McKinzie |
| 2011/0043328 A1 | 2/2011 | Bassali |
| 2011/0053524 A1 | 3/2011 | Manssen |
| 2011/0063042 A1 | 3/2011 | Mendolia |
| 2011/0086600 A1 | 4/2011 | Muhammad |
| 2011/0086630 A1 | 4/2011 | Manssen et al. |
| 2011/0102290 A1 | 5/2011 | Milosavljevic |
| 2011/0105023 A1 | 5/2011 | Scheer et al. |
| 2011/0116423 A1 | 5/2011 | Rousu et al. |
| 2011/0117863 A1 | 5/2011 | Camp, Jr. et al. |
| 2011/0117973 A1 | 5/2011 | Asrani et al. |
| 2011/0121079 A1 | 5/2011 | Lawrence et al. |
| 2011/0122040 A1 | 5/2011 | Wakabayashi et al. |
| 2011/0133994 A1 | 6/2011 | Korva |
| 2011/0140982 A1 | 6/2011 | Ozden et al. |
| 2011/0183628 A1 | 7/2011 | Baker |
| 2011/0183633 A1 | 7/2011 | Ohba et al. |
| 2011/0195679 A1 | 8/2011 | Lee et al. |
| 2011/0227666 A1 | 9/2011 | Manssen |
| 2011/0237207 A1 | 9/2011 | Bauder |
| 2011/0249760 A1 | 10/2011 | Chrisikos et al. |
| 2011/0250852 A1 | 10/2011 | Greene |
| 2011/0254637 A1 | 10/2011 | Manssen |
| 2011/0254638 A1 | 10/2011 | Manssen |
| 2011/0256857 A1 | 10/2011 | Chen et al. |
| 2011/0281532 A1 | 11/2011 | Shin et al. |
| 2011/0299438 A1 | 12/2011 | Mikhemar et al. |
| 2011/0306310 A1 | 12/2011 | Bai |
| 2011/0309980 A1 | 12/2011 | Ali et al. |
| 2012/0051409 A1 | 3/2012 | Brobston et al. |
| 2012/0062431 A1 | 3/2012 | Tikka et al. |
| 2012/0075159 A1 | 3/2012 | Chang |
| 2012/0084537 A1 | 4/2012 | Indukuru et al. |
| 2012/0094708 A1 | 4/2012 | Park |
| 2012/0100802 A1 | 4/2012 | Mohebbi |
| 2012/0112851 A1 | 5/2012 | Manssen |
| 2012/0112852 A1 | 5/2012 | Manssen et al. |
| 2012/0119843 A1 | 5/2012 | du Toit et al. |
| 2012/0119844 A1 | 5/2012 | du Toit et al. |
| 2012/0154975 A1 | 6/2012 | Oakes |
| 2012/0214421 A1 | 8/2012 | Hoirup |
| 2012/0220243 A1 | 8/2012 | Mendolia |
| 2012/0243579 A1 | 9/2012 | Premakanthan et al. |
| 2012/0286586 A1 | 11/2012 | Balm |

(56) References Cited

U.S. PATENT DOCUMENTS

| | | |
|---|---|---|
| 2012/0293384 A1 | 11/2012 | Knudsen et al. |
| 2012/0295554 A1 | 11/2012 | Greene et al. |
| 2012/0295555 A1 | 11/2012 | Greene et al. |
| 2012/0309332 A1 | 12/2012 | Liao et al. |
| 2013/0005277 A1 | 1/2013 | Klomsdorf et al. |
| 2013/0052967 A1 | 2/2013 | Black et al. |
| 2013/0056841 A1 | 3/2013 | Hsieh et al. |
| 2013/0076579 A1 | 3/2013 | Zhang et al. |
| 2013/0076580 A1 | 3/2013 | Zhang et al. |
| 2013/0106332 A1 | 5/2013 | Williams et al. |
| 2013/0122829 A1 | 5/2013 | Hyvonen et al. |
| 2013/0137384 A1 | 5/2013 | Desclos et al. |
| 2013/0154897 A1 | 6/2013 | Sorensen et al. |
| 2013/0215846 A1 | 8/2013 | Yerrabommanahalli et al. |
| 2013/0293425 A1 | 11/2013 | Zhu et al. |
| 2013/0315285 A1 | 11/2013 | Black et al. |
| 2014/0002323 A1 | 1/2014 | Ali et al. |
| 2016/0241276 A1 | 8/2016 | Zhu |
| 2016/0269055 A1 | 9/2016 | Greene et al. |
| 2016/0277129 A1 | 9/2016 | Manssen |
| 2016/0322991 A1 | 11/2016 | McKinzie |

FOREIGN PATENT DOCUMENTS

| | | |
|---|---|---|
| DE | 19614655 | 10/1997 |
| DE | 102008050743 | 4/2010 |
| DE | 102009018648 A1 | 10/2010 |
| EM | EP0909024 | 4/1999 |
| EP | 0685936 | 6/1995 |
| EP | 0909024 | 4/1999 |
| EP | 1079296 | 2/2001 |
| EP | 1137192 | 9/2001 |
| EP | 1298810 | 4/2006 |
| EP | 2214085 A2 | 8/2010 |
| EP | 2328233 | 6/2011 |
| EP | 2388925 A1 | 11/2011 |
| EP | 2424119 A1 | 2/2012 |
| EP | 2638640 A4 | 7/2014 |
| JP | 03276901 | 3/1990 |
| JP | 02-077580 | 9/1991 |
| JP | 9321526 | 12/1997 |
| JP | 10209722 | 8/1998 |
| JP | 2000124066 | 4/2000 |
| JP | 2005-130441 | 5/2005 |
| KR | 100645526 | 11/2006 |
| KR | 10-0740177 | 7/2007 |
| WO | 01/71846 | 9/2001 |
| WO | 2006/031170 | 3/2006 |
| WO | 2008/030165 | 3/2008 |
| WO | 2009/064968 | 5/2009 |
| WO | 2009/108391 A1 | 9/2009 |
| WO | 2009/155966 | 12/2009 |
| WO | 2010028521 A1 | 3/2010 |
| WO | 2010121914 A1 | 10/2010 |
| WO | 2011/044592 | 4/2011 |
| WO | 2011/084716 | 7/2011 |
| WO | 2011084716 A1 | 7/2011 |
| WO | 2011102143 A1 | 8/2011 |
| WO | 2011/133657 | 10/2011 |
| WO | 2011028453 | 10/2011 |
| WO | 2012/067622 | 5/2012 |
| WO | 2012/085932 | 6/2012 |
| WO | 2012085932 A2 | 6/2012 |

OTHER PUBLICATIONS

Bezooijen, A. et al., "A GSM/EDGE/WCDMA Adaptive Series-LC Matching Network Using RF-MEMS Switches", IEEE Journal of Solid-State Circuits, vol. 43, No. 10, Oct. 2008, 2259-2268.

Eiji, N., "High-Frequency Circuit and Its Manufacture", Patent Abstracts of Japan, vol. 1998, No. 13, Nov. 30, 1998 & JP 10 209722 A (Seiko Epson Corp), Aug. 7, 1998.

Hoirup, , "Method and apparatus for Radio Antenna Frequency Tuning", U.S. Appl. No. 13/030,177, filed Feb. 18, 2011.

Huang, Libo et al., "Theoretical and experimental investigation of adaptive antenna impedance matching for multiband mobile phone applications", IEEE, Sep. 7, 2005, 13-17.

Hyun, S., "Effects of strain on the dielectric properties of tunable dielectric SrTi03 thin films", Applied Physics Letters, vol. 79, No. 2, Jul. 9, 2001.

Ida, I. et al., "An Adaptive Impedence Matching System and Its Application to Mobile Antennas", TENCON 2004, IEEE Region 10 Conference, See Abstract ad p. 544, Nov. 21-24, 2004, 543-547.

Katsuya, K., "Hybrid Integrated Circuit Device", Patent Abstracts of Japan, Publication number: 03-276901, Date of publication of application: Sep. 12, 1991.

Manssen, "Method and Apparatus for Managing Interference in a Communication Device", U.S. Appl. No, 61/326,206, filed Apr. 20, 2010.

McKinzie, "Adaptive Impedance Matching Module (AIMM) Control Architectures", U.S. Appl. No. 13/293,544, filed Nov. 10, 2011.

McKinzie, "Adaptive Impedance Matching Module (AIMM) Control Architectures", U.S. Appl. No. 13/293,550, filed Nov. 10, 2011.

Mckinzie, "Method and Apparatus for Adaptive Impedance Matching", U.S. Appl. No. 13/217,748, Aug. 25, 2011.

Mendolia, "Method and Apparatus for Tuning a Communication Device", U.S. Appl. No. 13/035,417, filed Feb. 25, 2011.

Paratek Microwave, Inc. "Method and Appartus for Tuning Antennas in a Communication Device", International Application No. PCT/US11/59620; Filed Nov. 7, 2011.

Patent Cooperation Treaty, , "International Search Report and Written Opinion", International Application No. PCT/US2010/046241, Mar. 2, 2011.

Patent Cooperation Treaty, , "International Search Report and Written Opinion", International Application No. PCT/US2010/056413, Jul. 27, 2011.

Patent Cooperation Treaty, , "International Search Report and Written Opinion", Nov. 16, 2011, International Application No. PCT/US/2011/038543.

Patent Cooperation Treaty, , "International Search Report and Written Opinion", PCT Application No. PCT/US08/005085, Jul. 2, 2008.

Pervez, N.K., "High Tunability barium strontium titanate thin films for RF circuit applications", Applied Physics Letters, vol. 85, No. 19, Nov. 8, 2004.

Petit, Laurent , "MEMS-Switched Parasitic-Antenna Array for Radiation Pattern Diversity", IEEE Transactions on Antennas and Propagation, vol. 54, No. 9, Sep. 2009, 2624-2631.

Qiao, et al., "Antenna Impedance Mismatch Measurement and Correction for Adaptive COMA Transceivers", IEEE, Jan. 2005.

Qiao, et al., "Measurement of Antenna Load Impedance for Power Amplifiers", The Department of Electrical and Computer Engineering, University of California, San Diego, Sep. 13, 2004.

Stemmer, Susanne , "Low-loss tunable capacitors fabricated directly on gold bottom electrodes", Applied Physics Letters 88, 112905, Mar. 15, 2006.

Taylor, T.R. , "Impact of thermal strain on the dielectric constant of sputtered barium strontium titanate thin films", Applied Physics Letters, vol. 80, No. 11, Mar. 18, 2002.

Tombak, Ali , "Tunable Barium Strontium Titanate Thin Film Capacitors for RF and Microwave Applications", IEEE Microwave and Wireles Components Letters, vol. 12, Jan. 2002.

Xu, Hongtao , "Tunable Microwave Integrated Circuits using BST Thin Film Capacitors with Device", Integrated Ferroelectrics, Department of Electrical Engineering and Computer Engineering, University of California, 2005, Apr. 2005.

Zuo, S. , "Eigenmode Decoupling for Mimo Loop-Antenna Based on 180 Coupler", Progress In Electromagnetics Research Letters, vol. 26, Aug. 2011, 11-20.

"European Search Report", 16151299.1 search report, 2016.

"Extended European Search Report", EP Application No. 16155235.1, May 3, 2016.

(56) References Cited

OTHER PUBLICATIONS

"Search Report", ROC (Taiwan) Patent Application No. 101117467, English Translation, Apr. 12, 2016, 1 page.
Canadian Office Action, Application No. 2,821,173, Oct. 17, 2016.

\* cited by examiner

100

200

Reduce size of S5 to make Q only good in low band since circuits usually need less capacitance in high band.

Allows substrate to not connect to $S_5/C_5$ in order to reduce off capacitance

Uses external high Q cap to allow the switch to be smaller and still maintain the Q of the total Cap

| Switch activation matrix | Capacitance in Binary Array | | | | |
|---|---|---|---|---|---|
| | #1 | #2 | #3 | #4 | |
| Binary Control Word | 2 pF | 1 pF | 0.5 pF | 0.25 pF | Total Capacitance |
| 15 | 1 | 1 | 1 | 1 | 3.75 |
| 14 | 1 | 1 | 1 | 0 | 3.5 |
| 13 | 1 | 1 | 0 | 1 | 3.25 |
| 12 | 1 | 1 | 0 | 0 | 3 |
| 11 | 1 | 0 | 1 | 1 | 2.75 |
| 10 | 1 | 0 | 1 | 0 | 2.5 |
| 9 | 1 | 0 | 0 | 1 | 2.25 |
| 8 | 1 | 0 | 0 | 0 | 2 |
| 7 | 0 | 1 | 1 | 1 | 1.75 |
| 6 | 0 | 1 | 1 | 0 | 1.5 |
| 5 | 0 | 1 | 0 | 1 | 1.25 |
| 4 | 0 | 1 | 0 | 0 | 1 |
| 3 | 0 | 0 | 1 | 1 | 0.75 |
| 2 | 0 | 0 | 1 | 0 | 0.5 |
| 1 | 0 | 0 | 0 | 1 | 0.25 |
| 0 | 0 | 0 | 0 | 0 | 0 |

FIG. 21

| Switch activation matrix | Capacitance in Non-binary Array | | | | | |
|---|---|---|---|---|---|---|
| | #1 | #2 | #3 | #4 | #5 | |
| Binary Control Word | 1 pF | 1 pF | 1 pF | 0.5 pF | 0.25 pF | Total Capacitance |
| 15 | 1 | 1 | 1 | 1 | 1 | 3.75 |
| 14 | 1 | 1 | 1 | 1 | 0 | 3.5 |
| 13 | 1 | 1 | 1 | 0 | 1 | 3.25 |
| 12 | 1 | 1 | 1 | 0 | 0 | 3 |
| 11 | 0 | 1 | 1 | 1 | 1 | 2.75 |
| 10 | 0 | 1 | 1 | 1 | 0 | 2.5 |
| 9 | 0 | 1 | 1 | 0 | 1 | 2.25 |
| 8 | 0 | 1 | 1 | 0 | 0 | 2 |
| 7 | 0 | 0 | 1 | 1 | 1 | 1.75 |
| 6 | 0 | 0 | 1 | 1 | 0 | 1.5 |
| 5 | 0 | 0 | 1 | 0 | 1 | 1.25 |
| 4 | 0 | 0 | 1 | 0 | 0 | 1 |
| 3 | 0 | 0 | 0 | 1 | 1 | 0.75 |
| 2 | 0 | 0 | 0 | 1 | 0 | 0.5 |
| 1 | 0 | 0 | 0 | 0 | 1 | 0.25 |
| 0 | 0 | 0 | 0 | 0 | 0 | 0 |

FIG. 22

METHOD AND APPARATUS FOR ADAPTING A VARIABLE IMPEDANCE NETWORK

CROSS-REFERENCE TO RELATED APPLICATION(S)

This application is a continuation of U.S. patent application Ser. No. 12/729,221 filed Mar. 22, 2010 by Keith Manssen et al., entitled "Method and Apparatus for Adapting a Variable Impedance Network." All sections of the aforementioned application(s) are incorporated herein by reference in its entirety.

FIELD OF THE DISCLOSURE

The present disclosure relates to variable impedance networks and more specifically to a method and apparatus for adapting a variable impedance network.

BACKGROUND

Existing multi-frequency wireless devices (e.g., radios) use an antenna structure that attempts to radiate at optimum efficiency over the entire frequency range of operation, but can really only do so over a subset of the frequencies. Due to size constraints, and aesthetic design reasons, an antenna designer may be forced to compromise the performance in some of the frequency bands. An example of such a wireless device could be a mobile telephone that operates over a range of different frequencies, such as 800 MHz to 2200 MHz. The antenna will not radiate efficiently at all frequencies due to the nature of the design, and the power transfer between the antenna, the power amplifier, and the receiver in the radio can vary a considerable amount.

Additionally, an antenna's performance can be impacted by its operating environment. For example, multiple use cases exist for radio handsets, which include such conditions as the placement of the handset's antenna next to a user's head, in the user's pocket, the covering of an antenna with a hand, a pull-out antenna in the up position or down position, a flip phone with the lid open versus closed, hands-free operation with a Bluetooth headset or speakerphone feature, or other operational possibilities, all of which can affect the wireless device antenna's radiated efficiency.

Many existing radios use a simple circuit composed of fixed value components that are aimed at improving the power transfer from power amplifier to antenna, or from the antenna to the receiver, but since the components used are fixed in value there is typically a compromise when attempting to cover multiple frequency bands and multiple use cases.

Prior art systems have attempted to solve this problem by employing a variety of tunable elements in the radio frequency path, thus attempting to compensate for changing antenna performance. Typically, prior art system arrange these adjustable elements into single device substrates or semiconductor die, both to re-use control and bias circuitry between several tunable capacitors on the same die and to reduce the number of input/output connection pads necessary to connect the devices to external circuitry.

BRIEF DESCRIPTION OF THE DRAWINGS

FIG. 21 shows TABLE 1 which depicts an illustrative embodiment of a table with digital logic for controlling of a binary-switched capacitor array; and FIG. 22 shows TABLE 2 which depicts an illustrative embodiment of a table with digital logic for controlling a non-binary-switched capacitor array.

DETAILED DESCRIPTION

An embodiment of the present disclosure can entail a tunable capacitor having a decoder for generating a plurality of control signals, and an array of tunable switched capacitors comprising a plurality of fixed capacitors coupled to a plurality of switches. The plurality of switches can be controlled by the plurality of control signals to manage a tunable range of reactance of the array of tunable switched capacitors. Additionally, the array of tunable switched capacitors is adapted to have non-uniform quality (Q) factors.

An embodiment of the present disclosure can entail a variable matching network having a plurality of tunable capacitors contained on a single substrate. The single substrate can have a plurality of ports coupled to portions of the plurality of tunable capacitors. Additionally, the variable matching network can be configurable in a plurality of topologies by way of the plurality of ports.

An embodiment of the present disclosure can entail a device having first and second variable capacitors within a single substrate with each end of said first and second variable capacitors having an accessible external port, wherein the first and second variable capacitors are adapted to be configured as a Tee, Pi or L circuit topology.

An embodiment of the present disclosure can entail a method for causing an array of tunable switched capacitors to adapt to a variable load impedance, wherein the array of tunable switched capacitors is configured to have non-uniform Q factors.

An embodiment of the present disclosure can entail a tunable capacitor on a die having a decoder for generating a plurality of control signals, and an array of tunable switched capacitors including a plurality of fixed capacitors coupled to a plurality of switches. The plurality of switches can be controlled by the plurality of control signals to manage a tunable range of reactance of the array of tunable switched capacitors. One of the plurality of fixed capacitors can be optionally coupled to the array to reduce an aggregate parasitic capacitance of the array of tunable switched capacitors. The array of tunable switched capacitors can be adapted to have uniform quality (Q) factors.

Figure 1:
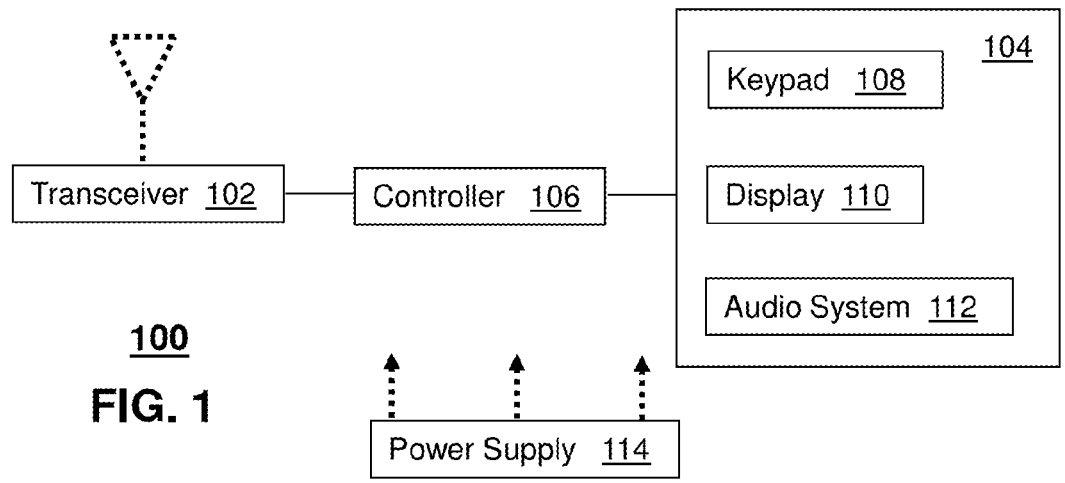
FIG. 1 depicts an illustrative embodiment of a communication device.

FIG. 1 depicts an exemplary embodiment of a communication device 100. The communication device 100 can comprise a wireless transceiver 102 (herein having independent transmit and receiver sections, a user interface (UI) 104, a power supply 114, and a controller 106 for managing operations thereof. The wireless transceiver 102 can utilize short-range or long-range wireless access technologies such as Bluetooth, WiFi, Digital Enhanced Cordless Telecommunications (DECT), or cellular communication technologies, just to mention a few. Cellular technologies can include, for example, CDMA-1X, WCDMA, UMTS/HSDPA, GSM/GPRS, TDMA/EDGE, EV/DO, WiMAX, and next generation cellular wireless communication technologies as they arise.

The UI 104 can include a depressible or touch-sensitive keypad 108 with a navigation mechanism such as a roller ball, joystick, mouse, or navigation disk for manipulating operations of the communication device 100. The keypad 108 can be an integral part of a housing assembly of the communication device 100 or an independent device operably coupled thereto by a tethered wireline interface (such as a flex cable) or a wireless interface supporting for example Bluetooth. The keypad 108 can represent a numeric dialing keypad commonly used by phones, and/or a Qwerty keypad with alphanumeric keys. The UI 104 can further include a display 110 such as monochrome or color LCD (Liquid Crystal Display), OLED (Organic Light Emitting Diode) or other suitable display technology for conveying images to an end user of the communication device 100. In an embodiment where the display 110 is a touch-sensitive display, a portion or all of the keypad 108 can be presented by way of the display.

The power supply 114 can utilize common power management technologies (such as replaceable batteries, supply regulation technologies, and charging system technologies) for supplying energy to the components of the communication device 100 to facilitate portable applications. The controller 106 can utilize computing technologies such as a microprocessor and/or digital signal processor (DSP) with associated storage memory such a Flash, ROM, RAM, SRAM, DRAM or other like technologies.

Figure 2:
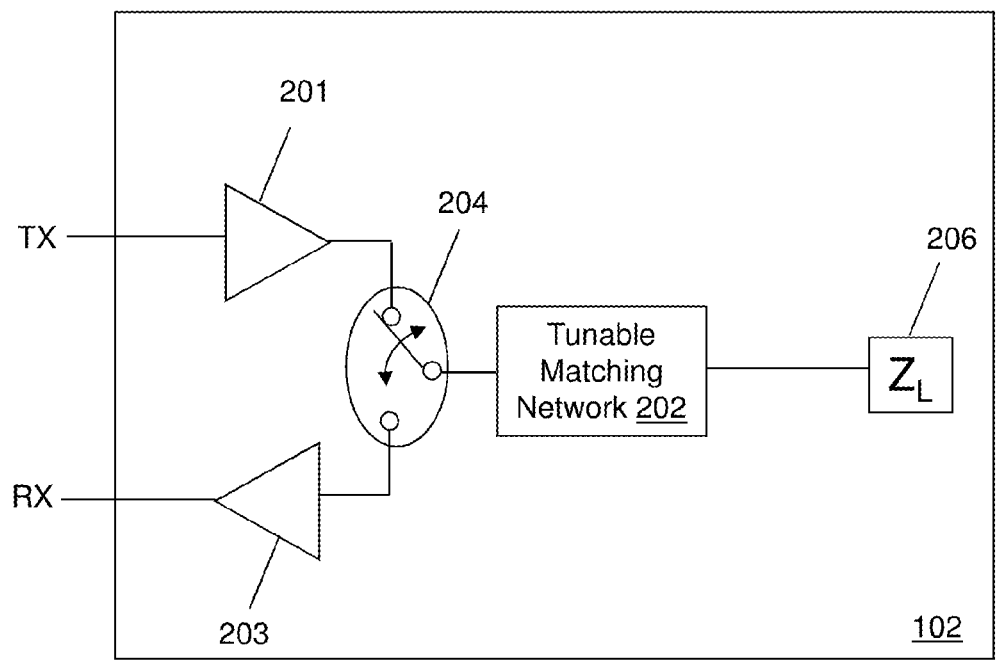
FIG. 2 depicts an illustrative embodiment of a portion of a transceiver of the communication device of FIG. 1.

FIG. 2 depicts an illustrative embodiment of a portion of the wireless transceiver 102 of the communication device 100 of FIG. 1. In GSM applications, the transmit and receive portions of the transceiver 102 can include common amplifiers 201, 203 coupled to a tunable matching network 202 and an impedance load 206 by way of a switch 204. The load 206 in the present illustration can an antenna as shown in FIG. 1 (herein antenna 206). A transmit signal in the form of a radio frequency (RF) signal (TX) can be directed to the amplifier 201 which amplifies the signal and directs the amplified signal to the antenna 206 by way of the tunable matching network 202 when switch 204 is enabled for a transmission session. The receive portion of the transceiver 102 can utilize a pre-amplifier 203 which amplifies signals received from the antenna 206 by way of the tunable matching network 202 when switch 204 is enabled for a receive session. Other configurations of FIG. 2 are possible for other types of cellular access technologies such as CDMA. These undisclosed configurations are contemplated by the present disclosure.

Figure 3:
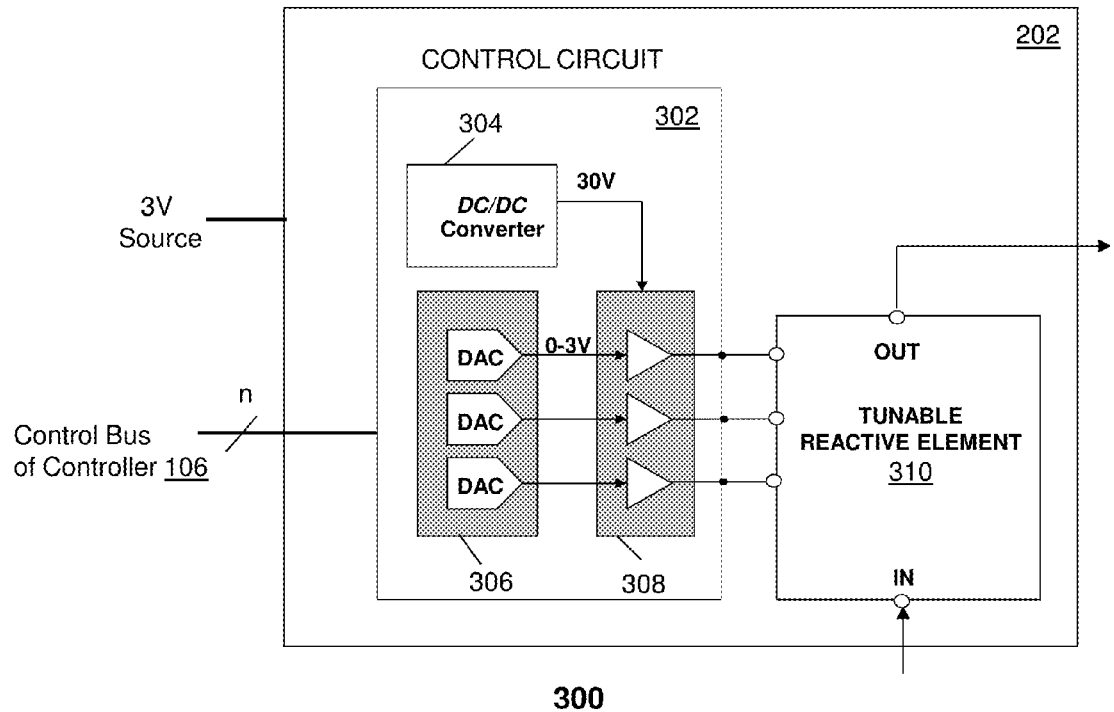
FIGS. 3-4 depict illustrative embodiments of a tunable matching network of the transceiver of FIG. 2.
Figure 4:
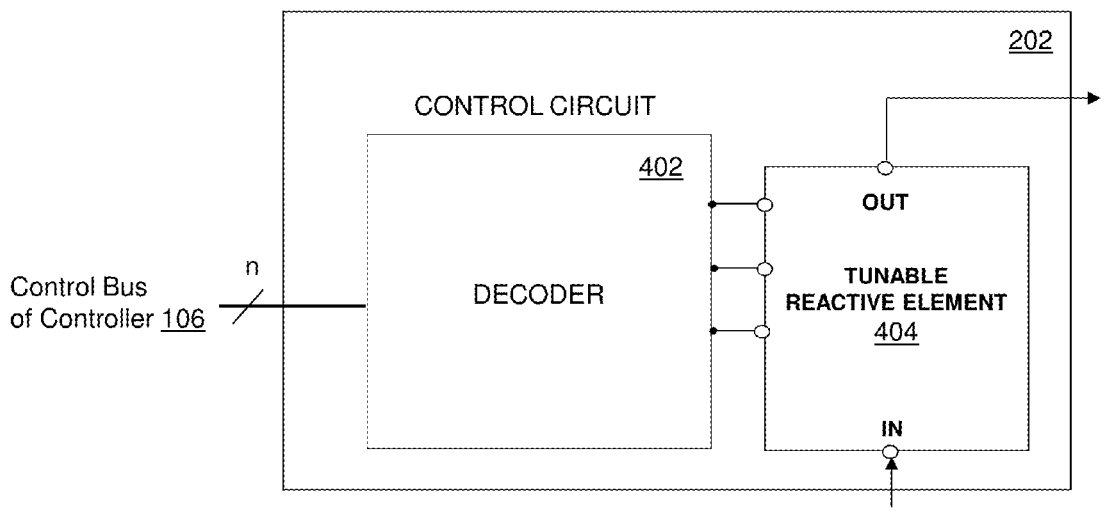
Figure 5:
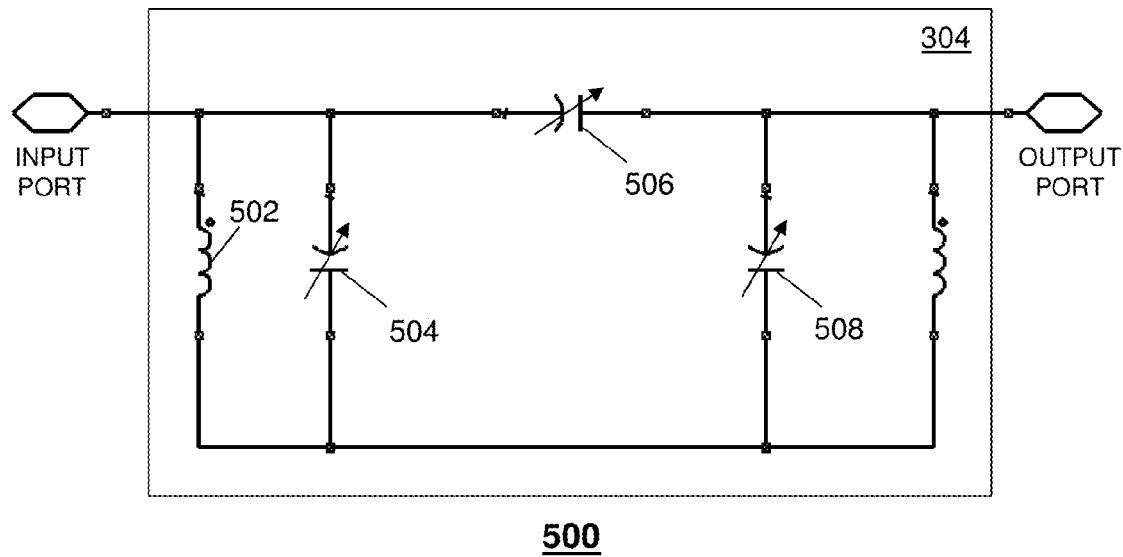
FIGS. 5-6 depict illustrative embodiments of a tunable reactive element of the tunable matching network.

FIGS. 3-4 depict illustrative embodiments of the tunable matching network 202 of the transceiver 102 of FIG. 2. In one embodiment, the tunable matching network 202 can comprise a control circuit 302 and a tunable reactive element 310. The control circuit 302 can comprise a DC-to-DC converter 304, one or more digital to analog converters (DACs) 306 and one or more corresponding buffers 308 to amplify the voltage generated by each DAC. The amplified signal can be fed to one or more tunable reactive components 504, 506 and 508 such as shown in FIG. 5, which depicts a possible circuit configuration for the tunable reactive element 310. In this illustration, the tunable reactive element 310 includes three tunable capacitors 504-508 and an inductor 502 with a fixed inductance. Other circuit configurations are possible, and thereby contemplated by the present disclosure.

The tunable capacitors 504-508 can each utilize technology that enables tunability of the capacitance of said component. One embodiment of the tunable capacitors 504-508 can utilize voltage or current tunable dielectric materials such as a composition of barium strontium titanate (BST). An illustration of a BST composition is the Parascan® Tunable Capacitor. In another embodiment, the tunable reactive element 310 can utilize semiconductor varactors. Other present or next generation methods or material compositions that can support a means for a voltage or current tunable reactive element are contemplated by the present disclosure.

The DC-to-DC converter 304 can receive a power signal such as 3 Volts from the power supply 114 of the communication device 100 in FIG. 1. The DC-to-DC converter 304 can use common technology to amplify this power signal to a higher range (e.g., 30 Volts) such as shown. The controller 106 can supply digital signals to each of the DACs 306 by way of a control bus of "n" or more wires to individually control the capacitance of tunable capacitors 504-508, thereby varying the collective reactance of the tunable matching network 202. The control bus can be implemented with a two-wire common serial communications technology such as a Serial Peripheral Interface (SPI) bus. With an SPI bus, the controller 106 can submit serialized digital signals to configure each DAC in FIG. 3 or the switches of the tunable reactive element 404 of FIG. 4. The control circuit 302 of FIG. 3 can utilize common digital logic to implement the SPI bus and to direct digital signals supplied by the controller 106 to the DACs.

Figure 6:
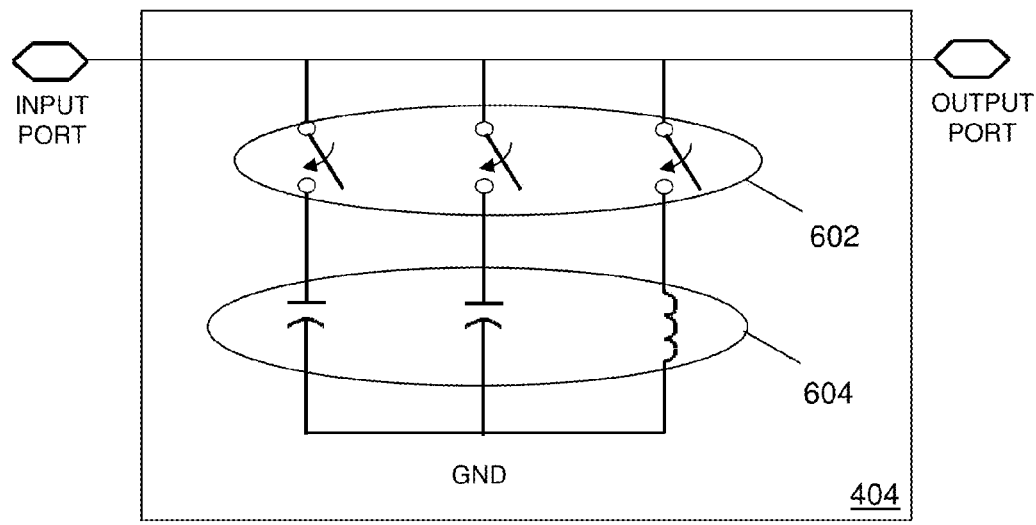

In another embodiment, the tunable matching network 202 can comprise a control circuit 402 in the form of a decoder and a tunable reactive element 404 comprising switchable reactive elements such as shown in FIG. 6. In this embodiment, the controller 106 can supply the control circuit 402 signals via the SPI bus which can be decoded with common Boolean or state machine logic to individually enable or disable the switching elements 602. The switching elements 602 can be implemented with semiconductor switches or micro-machined switches such as utilized in micro-electromechanical systems (MEMS). By independently enabling and disabling the reactive elements (capacitor or inductor) of FIG. 6 with the switching elements 602, the collective reactance of the tunable reactive element 404 can be varied.

The tunability of the tunable matching networks 202, 204 provides the controller 106 a means to optimize performance parameters of the transceiver 102 such as, for example, but not limited to, transmitter power, transmitter efficiency, receiver sensitivity, power consumption of the communication device, a specific absorption rate (SAR) of energy by a human body, frequency band performance parameters, and so on. To achieve one or more desirable performance characteristics which can be defined, the communication device 100 utilizes a tuning state selection method as depicted in FIG. 7.

Figure 7:
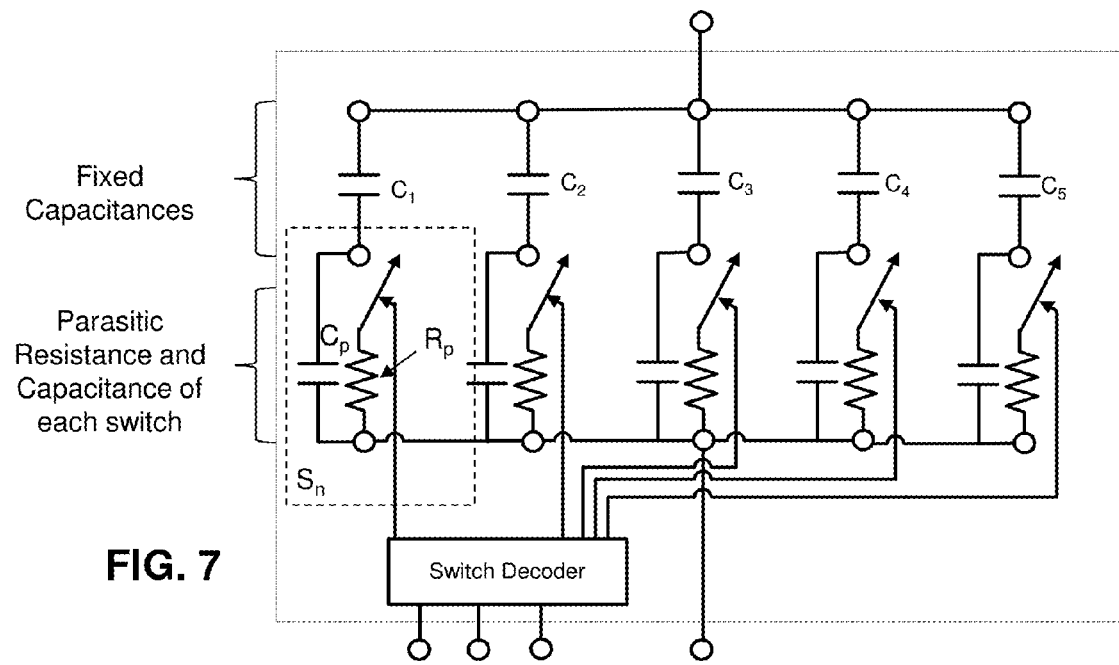
FIG. 7 depicts an illustrative embodiment of a switched variable capacitor array controlled by a switch decoder.

FIG. 7 depicts an illustrative embodiment of a switched variable capacitor array controlled by a switch decoder. The switched variable capacitor array can collectively represent one variable capacitor having a tuning range of operation which depends on the switching logic used to add and remove the fixed capacitors ($C_1$-$C_5$) shown in the top portion. Each of the fixed capacitors $C_1$-$C_5$ can be removed or applied to the array by a semiconductor (or MEMS) switch ($S_1$) controlled by a switch decoder that utilizes common Boolean and/or state machine logic to enable or disable the switches according to a predetermined tuning range. Each switch ($S_1$) has parasitic on-resistance and off-capacitance that can be controlled by an integrated circuit designer by the channel size of the switch and by the number of parallel and/or series semiconductor (or MEMS) switches used. The structure and size of each switch ($S_1$) determines the magnitude of these parasitics and the affect it has on the operating characteristics of the switched variable capacitor array as will be discussed shortly. For ease of discussion, references may be made to FIG. 8 which depicts an illustrative embodiment of a simplified diagram of the switched variable capacitor array of FIG. 7 without the switch decoder.

Figure 8:
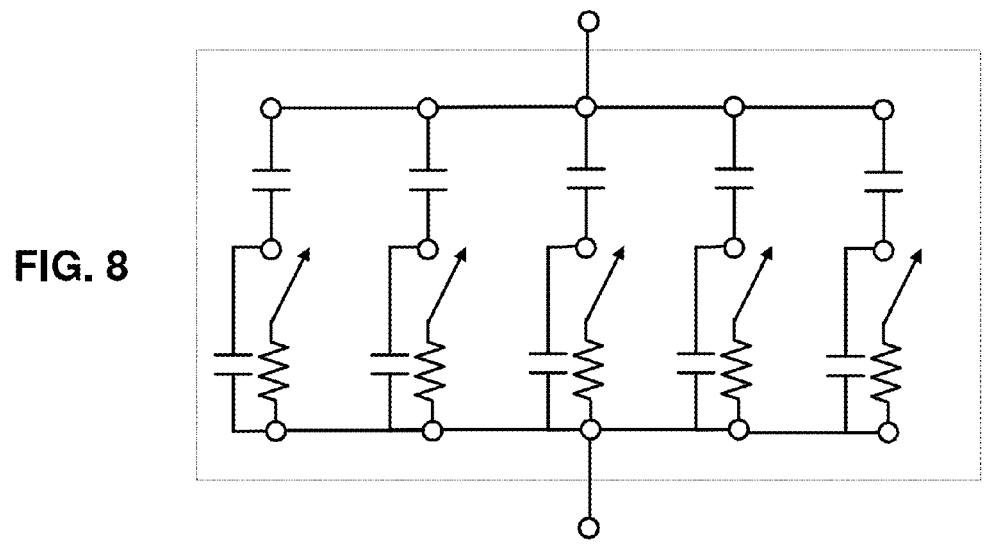
FIG. 8 depicts an illustrative embodiment of a simplified diagram of the switched variable capacitor array of FIG. 7.
Figure 9:
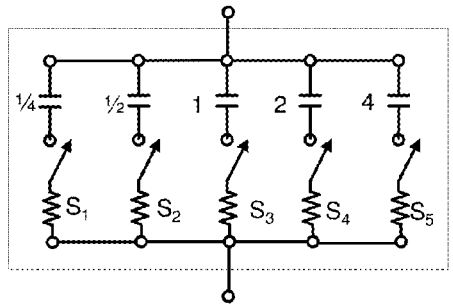
FIGS. 9-11 depict illustrative embodiments for improving a switched variable capacitor array.
Figure 10:
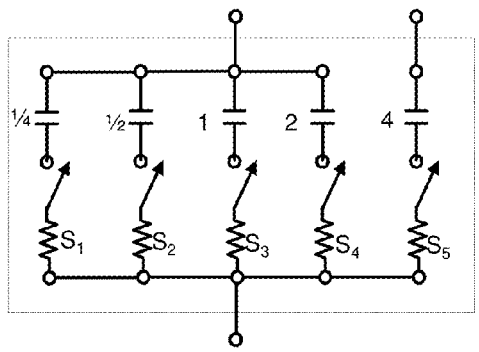
Figure 11:
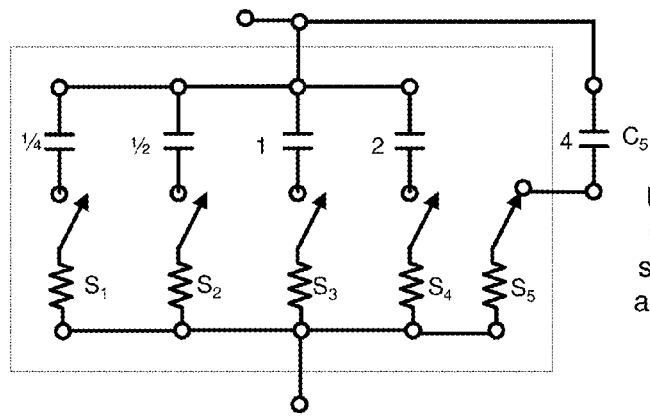

FIGS. 9-11 depict illustrative embodiments for improving the switched variable capacitor array of FIG. 8. Note that although FIGS. 9-11 do not show the parasitic capacitance depicted in FIGS. 7-8, such capacitance is inherently present in switches $S_1$-$S_5$, but not shown to simplify the illustration in these figures.

One embodiment of the present disclosure can entail changing the configuration and connections of the binary array of switchable capacitors such that some portions of the array, typically the largest capacitor in the array ($C_5$), can be left unconnected from the substrate if the larger value is not required by a specific tunable matching network for a specific application. For instance a typical switchable capacitor binary array can have the following values in the array: ¼ pF, ½ pF, 1 pF, 2 pF and 4 pF (shown in FIGS. 9-11). This array can theoretically be tunable between 0 pF and 7¾ pF by either connecting or disconnecting none, some or all of the capacitors in the array to the tunable matching network. However, there are practical limitations to the minimum capacitance which can be achieved in the actual fabrication of such a binary array.

Specifically, the switches themselves can have a certain amount of parasitic off-capacitance as shown in FIG. 8 which is present when the switch is in the "open" configuration, thus this parasitic capacitance limits the minimum capacitance value of the array to a value larger than zero. It is common for each individual capacitor-switch combination (e.g., $C_1$-$S_1$) shown in FIGS. 9-11 to have parasitic resistance and capacitance ($C_p$, $R_p$) shown in the switch combination $S_n$ of FIG. 7. As the switches are made larger, which is necessary as the switched capacitance gets larger (to maintain circuit quality factor Q and reduce losses), this parasitic capacitance grows proportionally. Thus, arrays that have large values of capacitance and are able to adjust to higher total capacitance values are inherently limited in how low they can also adjust.

For illustration purposes, suppose the parasitic capacitance of each capacitor-switch combination is ¼ the value of the fixed capacitor of the capacitor-switch combination. One can gather that the parasitic capacitance of the first capacitor-switch combination would be 1/16 pF, the second capacitor-switch combination ⅛ pF, the third capacitor-switch combination ¼ pF, the fourth capacitor-switch combination ½ pF, and the fifth capacitor-switch combination 1 pF. When all switches are in the off state, the aggregate off capacitance is 1.9375 pF which can be approximated to 2 pF. The maximum capacitance of the array of five capacitors is 7.75 pF (¼+½+1+2+4) which can be approximated to 8 pF. Taking into consideration parasitic capacitance in the off state, and the total capacitance of all fixed capacitors when engaged, one can surmise that the binary array of FIG. 9 as a 4:1 tuning ratio. The parasitic capacitance of the largest corresponding switch ($S_5$) can add 1 pF which limits the minimum value of the array to 2 pF, thereby increasing the minimum capacitance value available to the circuit.

One aspect of a switched capacitor is that the circuit quality or Q of the switched capacitor includes the resistive losses in the MEMS or semiconductor switch which is in series with the capacitor. The Q of the resultant switched capacitor is the ratio of the reactance of the capacitor to the resistance of the combined switch and capacitor which we will define as $R_{total}$.

$$R_{total} = R_{sw} + R_{cap}$$

Where $R_{sw}$ is the resistance of the switch connected to a particular capacitor and $R_{cap}$ is the effective series resistance of the particular capacitor in the array. The reactance of the capacitor, Xc is:

$$Xc = \frac{1}{\omega C},$$

where $\omega = 2\pi f$ where f is the frequency of operation. Therefore, the Q of the switched capacitor is:

$$Q = \frac{X_c}{R_{total}} = \frac{1/\omega C}{R_{total}} = \frac{1}{\omega R_{total} C} = \frac{1}{2\pi f R_{total} C} = \frac{1}{2\pi f (R_{sw} + R_{cap}) C}$$

A similar analysis can be done wherein the switched reactances are inductors instead of capacitors. In that case, the reactance of the inductor, $X_L$ is:

$$X_L = \omega L,$$

where $\omega = 2\pi f$ where f is the frequency of operation. Therefore, the Q of the switched inductor is:

$$Q = \frac{X_L}{R_{total}} = \frac{\omega L}{R_{total}} = \frac{2\pi f L}{R_{total}} = \frac{2\pi f L}{(R_{sw} + R_{cap})}$$

Correspondingly, in order to maintain Q at a given frequency of operation, the resistance of the switch in the array must be inversely proportional to the size of the inductor in the array. Therefore, if an inductor in the array is one half the size of the next inductor in the array, the resistance of that switch must also be one half the resistance of the switch for the preceding inductor. As such, the smallest inductor in the array must have the largest switch (in order to reduce resistance and hence maintain Q) which is the opposite relationship of the switchable capacitor array. However, although the relationship is reversed by virtue of the nature of the reactance of the switched component, it is understood that all of the characteristics and attributes being described herein can be applied to either capacitors or inductors with this simple modification. What follows are illustrative embodiments of tunable switched capacitor arrays. However, a tunable switched inductor array is also contemplated by the present disclosure.

Typically, for size and cost reasons the fixed capacitors in the array will be situated within the semiconductor die and will be built using typical semiconductor capacitor fabrication methods such as metal-insulator-metal (MIM) or other known technologies. These semiconductor capacitor technologies are typically limited in the Q values they are capable of achieving, and as seen in the expressions above, the Q of these fixed capacitors has a significant impact on the total Q of the tunable capacitor array, and as such force the designer to size the switches large enough to compensate for the limited Q of the fixed capacitors. This limitation has the most impact on the die size of the switch connected to the largest value capacitor in the array.

Replacing this largest value capacitor with an external fixed capacitor would allow the designer to utilize a capacitor with a Q perhaps twice the Q available from semiconductor capacitors, and by doing so would allow the designer to reduce the size of the largest switch in the array significantly—see FIG. 11. For example, if the designer needed to maintain a Q factor for the switched capacitor of 60, by using an external capacitor with a Q of 250 instead of an internal semiconductor capacitor with a Q of 150 the designer would be able to increase the resistance of the switch on that capacitor by over 25%, which would allow the die area of that particular switch to be about 20% smaller. Since the switch for the largest capacitor in the binary array usually accounts for about ½ of the total switch die area of the array, this area savings would amount to approximately 10% of the total array switch area.

As was stated previously, in a typical switched capacitor binary array, the individual capacitor values are selected such that each capacitor is twice the capacitance of the previous capacitor in the array, with the smallest capacitor being the size required for the minimum resolution of the tunable capacitor. One can see that as the value of C increases, in order to maintain a particular Q value the resistance of the switch connected to the capacitor has to be decreased inversely proportionally. From further examination of the expression for Q, it can also be seen that the Q of the switched capacitor is inversely proportional to the operating frequency, such that the minimum Q value is apparent at the highest operating frequency of the capacitor. In other words, the switch must be designed to have a resistance small enough to maintain the target Q value at the highest frequency of operation.

This characteristic has an aspect that can be taken advantage of when a tunable capacitor such as shown in FIGS. 7-11 is utilized in a matching network of a cellular handset that operates over a wide frequency range such as, for example, 850 MHz, 900 MHz, 1800 MHz and 1900 MHz frequency bands. For convenience we will refer to the 850 MHz and 900 MHz bands as the "low bands" as they are both below 1 GHz and the 1800 MHz and 1900 MHz bands as the "high bands" as they are both just below 2 GHz. Considering the above expression for the Q of a switched capacitor, it is evident that in order to maintain the same value of Q, the resistance of a switch would need to be approximately half as large for a capacitor of a given value operating in the high bands as it would be for the same capacitor operating in the low bands. To accomplish this on a MEMS or semiconductor switch die would correspondingly require twice the die area to create the switch for the capacitor to operate in the high band as it would to operate in the low band.

It is another characteristic typical of tunable matching networks that larger value capacitors are usually only required when operating in the low band, while smaller capacitors are typically utilized when operating in the high band. This is primarily due to the fact that the reactance is an inverse function of the operating frequency as seen above, and as frequency increases, large value capacitors become very low in reactance, and as such have little effect on tuning or matching at high band frequencies when they are placed in a circuit in a series configuration, and would have too large an effect on tuning or matching when placed in a circuit in a shunt configuration.

This characteristic can be exploited in one embodiment of the present disclosure whereby the largest capacitor in a switchable capacitor binary array could be switched by a semiconductor or MEMS switch that had a larger resistance than that which would be required to maintain the target Q value in the high band, but instead sized to only maintain the target Q value in the low band—see FIG. 9. Doing so would significantly reduce the die area of the switch associated with the large value capacitor, and correspondingly reduce the cost of the die. Given the approximate 2 to 1 relationship of the high band and low band frequencies, allowing the switch to be one half the size (twice the resistance) for the largest value capacitor would result in an approximate 25% savings in the die area required for the total switchable capacitor binary array, since the largest value capacitor in the binary array is approximately one half of the total capacitance in the array.

An embodiment of the present disclosure can be applied to tuning a single reactive circuit element such as an antenna or other resonant structure. In such cases, the tunable capacitor can operate in the circuit along with another reactive element such as an inductor, and in practice the circuit will be tuned in order to be resonant at the frequency of operation. By virtue of the tunable capacitance, such a circuit can be tuned over a range of frequencies.

As an example, the analysis below considers a resonant circuit containing an inductor of value L and capacitor of value C, for which the equation below describes the formula for the resonant frequency.

$$\omega_{res} = 2\pi f_{res} = 1/\sqrt{LC}$$

As the expression shows, the resonant frequency is inversely proportional to the square root of the value of the capacitor, and when the value of the tunable capacitor is adjusted to achieve resonance at the desired frequency of operation, the value of the tunable capacitor will then be inversely proportional to the square of the desired frequency of operation. Correspondingly, at higher frequencies of operation, the capacitor will be tuned to lower values. Since the Q of the switched capacitor is an inverse function of C as was seen above, one can deduce that for each higher individual capacitor in a binary weighted array, the resistance will not need to be reduced by the same factor as the capacitance was increased. Therefore, while in order to maintain uniform Q of a tunable capacitor the switch resistance is usually cut in half (and switch die area doubled) for each doubling in capacitor size, for applications in which it is known that operating frequency is inversely proportional to the square root of the capacitance value the switch resistance can be made larger for larger capacitors in the array, thereby saving additional die area and cost.

As was shown above:

$$Q = \frac{1}{2\pi f R_{total} C}$$

Substituting for f to obtain an expression for $Q_{res}$ at $f_{res}$:

$$Q_{res} = \frac{1}{2\pi f_{res} RC} = \frac{1}{2\pi RC / 2\pi \sqrt{LC}} = \frac{\sqrt{L}}{R\sqrt{C}}$$

Solving for R at $f_{res}$:

$$R = \frac{\sqrt{L}}{Q\sqrt{C}}$$

And, if Q is maintained as $f_{res}$ is tuned to the frequency of operation:

$$R \propto \frac{1}{\sqrt{C}}$$

Therefore, in order to maintain circuit Q in such an application, the total resistance for a capacitor in the array which is two times the size of another capacitor in the array need only have the resistance reduced by a factor of 1.414 (or to 71% instead of 50%). Correspondingly, in an exemplary application, for the largest capacitor in a binary array, the size of the switch may be only 1.414 times the size of the switch for the next largest capacitor in the array instead of normally being twice the size (in an application where Q is maintained uniformly across all capacitor values at a given frequency). Utilizing an array with non-uniform Q can result in a 29% reduction in the size of this switch, and by applying this principal to the entire binary array, a reduction of approximately the same percentage of the total switch area can be accomplished.

While this analysis is representative for a tuned circuit that includes a simple resonant inductor-capacitor circuit, for other circuits the resonance may not follow the exact $f_{res} = 1/2\pi\sqrt{LC}$ relationship. However, in general, the circuit will typically require larger capacitance values at lower frequencies of operation, and once the exact relationship is determined, the appropriate scaling factor for the switch resistances required to achieve the required Q values can be determined and applied to the switched capacitor array.

A further extension of the above embodiment is to build the switched capacitor array in a non-binary fashion. That is, to not have each capacitor (except the smallest capacitors) in the array be one-half the capacitance of another capacitor in the array, but to rather have an array which splits the tunable capacitor into different non-binary-weighted capacitors. For example, an array of ¼ pF, ½ pF, 1 pF, 1 pF, 1 pF, can have the same tuning range as the binary weighted switched capacitor array ¼ pF, ½ pF, 1 pF, 2 pF, and can also have the same minimum resolution of ¼ pF (see TABLES 1-2). However, by further exploiting the characteristic explained above and allowing the Q of each individual capacitor and switch combination to vary, further reduction in total switch die size can be accomplished, and correspondingly, further reduction in die cost can be achieved. Since in some applications as described above, as the operating frequency is increased the tunable capacitor will typically be set to lower values of capacitance, each switch connected to the array of 1 pF capacitors (in this example) can be made of different size such that the total Q is maintained in the application. By allowing each 1 pF capacitor to individually be paired with a smaller switch, and activating them in a particular order, the Q of the total capacitance being switched into the tunable circuit can be maintained up to the frequency of operation.

In another embodiment this disadvantage can be overcome by allowing the largest value capacitor in the array (in the present illustration, the 4 pF capacitor) to be connected separately from the array by way of a port in the substrate as shown in FIGS. 10-11. In this way, if the design of the tunable capacitor requires a smaller total capacitance, the largest value in the array can be left unattached from the array, thereby allowing the tunable capacitor array to achieve smaller values of capacitance than if the largest capacitor was included in the circuit. In this embodiment, a circuit designer can choose between connecting the four smallest capacitors ($C_1$-$C_4$) which could give a tuning range of 1 pF (the approximate off capacitance of S1-S4, i.e., 1/16+1/8+1/4+1/2) to 4 pF (4:1 tuning), or connecting all five capacitors which can give a tuning range of 2 pF to 8 pF (4:1 tuning) as described earlier. Both choices are available on the same die. If the largest capacitor in the array were not separated from the array as shown in FIGS. 10 and 11, a designer would be limited by a minimum value of 2 pF when the array is in the "off" state—assuming the switch size of the largest capacitor followed a binary array.

Figure 12:
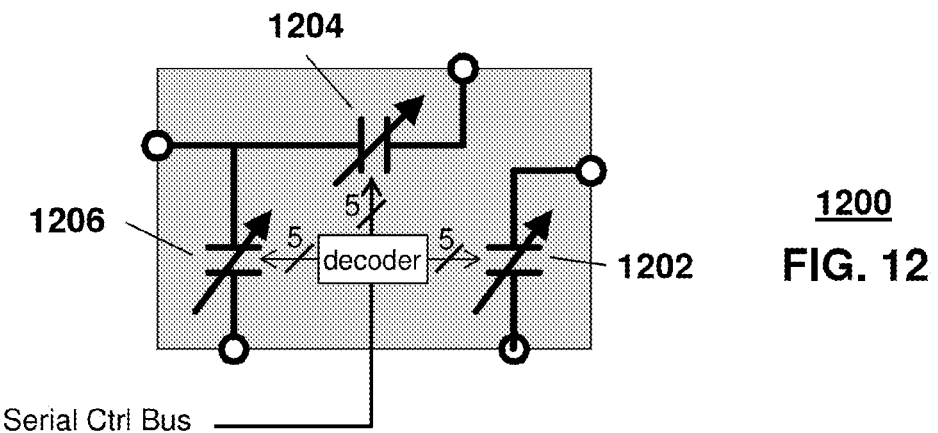
FIG. 12 depicts an illustrative embodiment for integrating any of the improved switched variable capacitor array of FIGS. 9-11 in a single Integrated Circuit (IC) or semiconductor die device.

One embodiment of the present disclosure can entail a single die such as shown in FIG. 12 that includes multiple tunable capacitors that can be placed onto circuit substrates which allow the tunable capacitors on the die to be connected into several different tunable matching network topologies which can be completely defined by the connecting metal patterns on the circuit substrates. It should be noted that the tuning range of each of the tunable capacitors can be controlled by a serial bus which feeds an independent decoder integrated with each tunable capacitor. These substrates can be multi-layer printed circuit boards, or multi-layer ceramic substrates and allow the die to connect to other electronic components such as fixed value capacitors and inductors which together embody the tunable matching network. Such substrates are typically very inexpensive, and as such multiple versions, embodying multiple schematic topologies can be kept in stock by a tunable matching network manufacturer, thus allowing the flexibility of quickly converting many different tunable matching network designs to production once the final design is determined.

One embodiment of the present disclosure can entail the inclusion of fixed value capacitors on the substrates which would connect in parallel with the tunable capacitors on the die to provide additional capacitor value range for the tunable matching network design. For instance, the tunable capacitor on the die may have the range of values from 1 picofarads to 5 picofarads, but by adding a fixed 2 picofarad capacitor in parallel, the effective range of the capacitor could be extended to 3 picofarads to 7 picofarads. This would reduce the tuning ratio from 5:1 to 7:3, but by extending the value provides flexibility which may be required to accomplish the matching impedances required for a specific application without changing the die which embodies the tunable capacitors.

Figure 13:
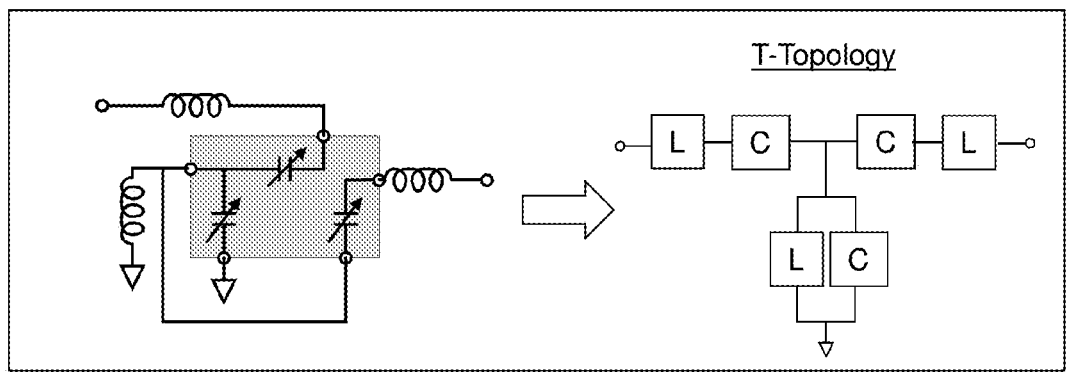
FIGS. 13-17 depict illustrative embodiments of topologies applied to the IC device of FIG. 12.
Figure 14:
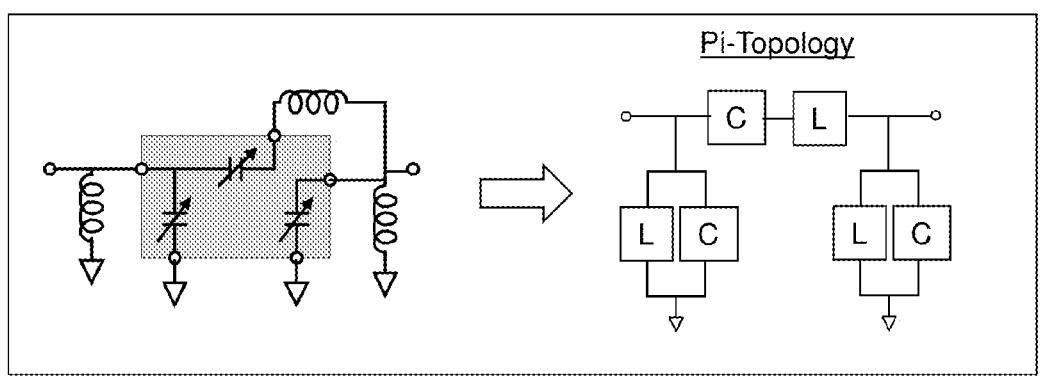
Figure 15:
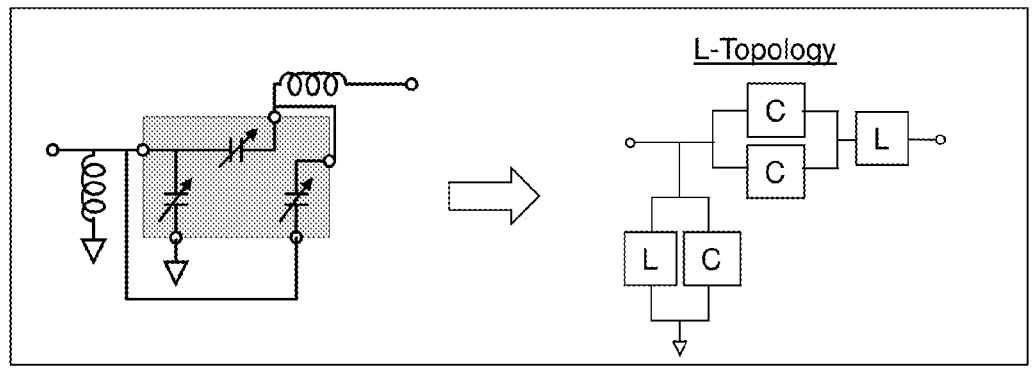
Figure 16:
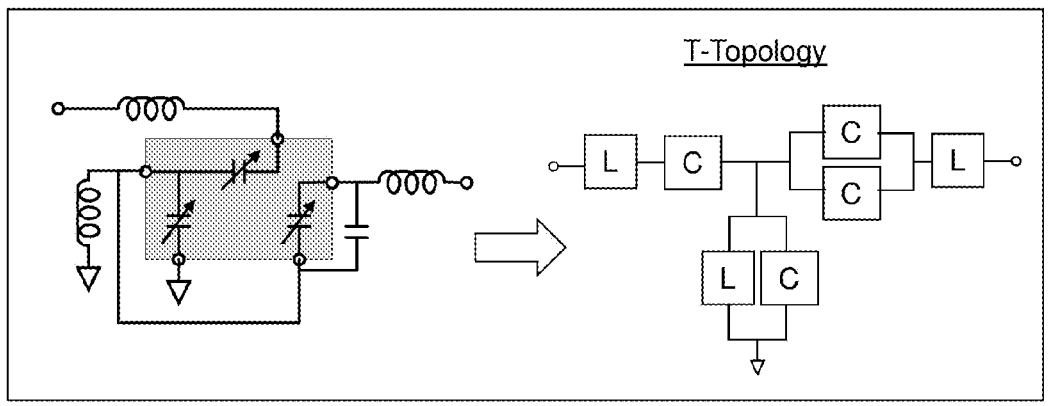
Figure 17:
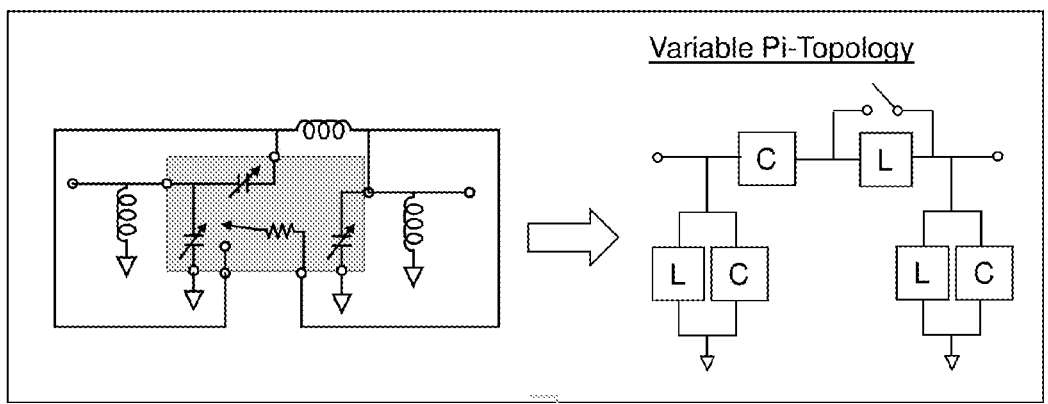

FIG. 12 depicts a block diagram of a single die that could contain 3 tunable capacitors connected in a manner that would allow the die to be connected in either a "Tee" configuration as shown in FIGS. 13 and 16, or a "Pi" configuration as shown in FIGS. 14 and 17, or an "L" configuration as shown in FIG. 15. It should be noted that tunable capacitor 1202 of FIG. 12 could be connected in parallel or in series with either of the other tunable capacitors on the die to create a tunable capacitor with either a larger total value or smaller (respectively) while still maintaining tuning ratio of the combined capacitance. Also note that a myriad of circuit topologies could be created with the three tunable capacitors on the die, and the module substrate is all that needs to change for this single die to support all these possible topologies. For example, an external fixed capacitor can be connected in parallel to one of the tunable capacitors on the die of FIG. 16 to increase the effective value of the tunable capacitor in parallel with said fixed capacitor.

Modern wireless systems need to support multiple modes and bands of operation. There can be multiple ways to architect a radio system to support such systems. In certain cases, antenna or other tunable matching networks may be deployed in separate circuit paths. One specific example would be to separate the circuit paths by frequency range, such as low band and high band ranges. Another example would be to separate the circuit paths transmit and receive. The illustrations in FIGS. 18-20 are specific to a high band-low band separation—additional embodiments are contemplated.

Figure 18:
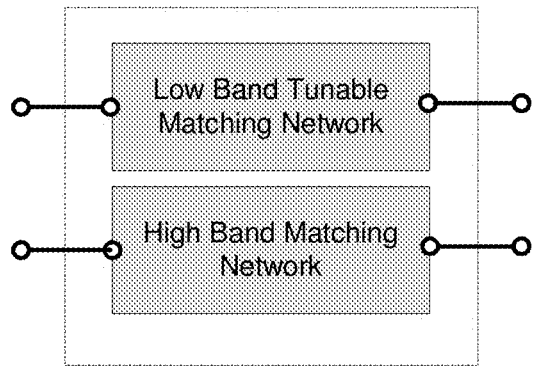
FIGS. 18-20 depict illustrative embodiments of low band and high band matching networks.
Figure 19:
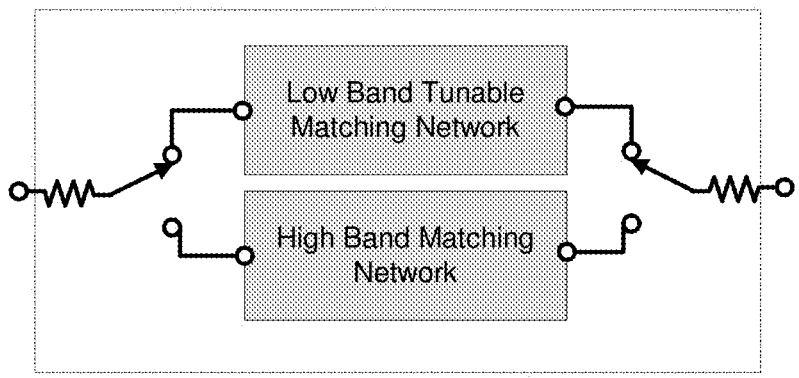

FIG. 18 depicts low band and high band independent matching networks on a single die. FIG. 19 depicts an embodiment in which signal switches are integrated into the tunable matching network die to allow the matching network to be divided into two separate paths. One or both paths can include tunable matching networks. One of the switches on one side of the matching networks of FIG. 19 could be eliminated while the switch on the other port is retained, which would allow such a tuner to be placed in front of a single input switchplexer (radio) but connected to a dual feed antenna, or two separate antennas. Alternatively, the switch on one side of the matching networks of FIG. 19 could be eliminated while the switch on the other port is retained, which would allow such a tuner to be placed in front of a single input antenna but connected to a dual input switchplexer (radio).

Figure 20:
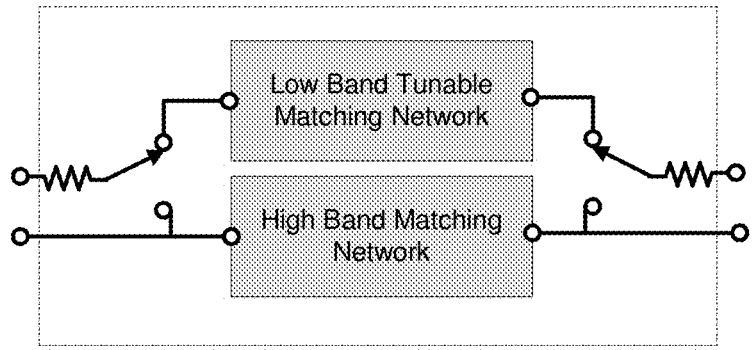

FIG. 20 depicts an embodiment that introduces additional flexibility to the integrated circuit die which embodies this circuit by allowing it to be used in both single path architectures and dual path architectures. It should be considered that a switch in FIG. 20 could be eliminated by fixing it in one position, allowing the tunable matching network to interface to a handset front end switchplexer that was configured to have two inputs rather than just a single antenna input. It should also be considered that a switch in FIG. 20 could be eliminated by fixing it in one position, allowing the tunable matching network to interface to a handset antenna that was configured to have two inputs rather than just a single antenna input.

In sum, one embodiment of the present disclosure can entail the inclusion of additional switches on the semiconductor or MEMS die of a matching network with the function of separating the signal paths within the tunable matching network. Such an approach can allow the designer to provide for separate tunable matching networks for either the low band or high band by switching the signal path at the input and outputs of two separate tunable matching networks, diverting the signal to one or the other depending upon the frequency of operation, or any other attribute by which the two paths could be distinguished. In some instances, one of the paths could consist of a simple "through" connecting the input to the output, or a fixed matching network thereby providing a tunable matching network in one band and a fixed matching network in the other band.

Referring to FIG. 17, one embodiment of the present disclosure can entail the inclusion of additional switches on the semiconductor or MEMS die of a matching network with the function of bypassing certain sections of the tunable impedance match. Certain tunable matching networks may include sections that could include for instance a series tunable capacitor and series inductor which may provide significant impedance tuning in the low band, but introduce a high impedance in the high band and as such introduce significant insertion loss in the high band. Bypassing, or shunting around these two parts could allow the tunable matching network to have much lower loss in the high band by effectively removing those components when they are not required. Other such circuit elements or sections of circuitry could be bypassed for similar reasons in either the low band or high band, or in some cases when matching particular impedances which do not require the specific elements being bypassed. This is an example of such an application but is not intended to limit the applications of such a shunt/bypass switch for use in tunable matching networks.

Generally speaking, to maximize the performance of a tunable matching network, and also to reduce the total cost, a typical tunable matching network should be designed uniquely for a specific application, and to do so would require a unique tunable capacitor die to be designed for each application. Experience shows that in the case where the application is a tunable matching network for a cellular handset antenna, this would require significant delays in the production of such a handset, since the tunable capacitor die would not be defined until after the handset antenna design was completed which is typically toward the end of the handset design cycle. Correspondingly, it would be very difficult for a handset designer to meet what are usually very aggressive schedule targets and use a tunable matching network that required a unique tunable capacitor die due to the issues described above. The various embodiments described in the present disclosure and others contemplated by the scope of the claims below clearly overcome the disadvantages of present systems.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A device, comprising:
   first and second variable capacitors on a single die, wherein the first and second variable capacitors are not in parallel, wherein each end of the first and second variable capacitors has an accessible external port,
   wherein the first and second variable capacitors are adapted to be configured as a Pi or L circuit topology.

2. The device of claim 1, comprising a switching system that includes a group of switches, wherein the switching system is coupled with the first and second variable capacitors to enable adjustment between a plurality of topologies according to switch positions of the group of switches, wherein the plurality of topologies includes the Pi circuit topology and the L circuit topology.

3. The device of claim 1, wherein a first end and a second end of the first variable capacitor have a first accessible external port and a second accessible external port respectively, wherein a first end and a second end of the second variable capacitor have a third accessible external port and a fourth accessible external port respectively, and wherein each of the first, second, third and fourth accessible external ports are different external ports.

4. The device of claim 1, wherein a plurality of the devices are utilized in a corresponding plurality of RF paths, wherein the plurality RF paths correspond to at least one of high or low band RF paths, and wherein the high or low band RF paths are switchable among a plurality of ports of the single die.

5. The device of claim 1, wherein at least one of the first or second variable capacitors is a voltage or current tunable capacitor comprising barium strontium titanate.

6. The device of claim 1, wherein the first and second variable capacitors comprise an array of tunable switched capacitors adapted to have non-uniform quality (Q) factors.

7. The device of claim 6, wherein the array of tunable switched capacitors comprises a plurality of fixed capacitors coupled to a plurality of switches.

8. The device of claim 7, wherein at least one of the plurality of switches comprises one of a plurality of semiconductor switches or a plurality of micro-electro-mechanical systems (MEMS) switches.

9. The device of claim 7, wherein the plurality of switches are scaled to reduce a size of the single die thereby providing the non-uniform Q factors in the array of tunable switched capacitors.

10. A device, comprising:
    first and second variable capacitors on a single die, wherein the first and second variable capacitors are not in parallel, wherein each end of the first and second variable capacitors has an accessible external port,
    wherein the first and second variable capacitors are adapted to be configured as a Pi circuit topology.

11. The device of claim 10, comprising a switching system that includes a group of switches, wherein the switching system is coupled with the first and second variable capacitors to enable adjustment between a plurality of topologies according to switch positions of the group of switches, wherein the plurality of topologies includes the Pi circuit topology.

12. The device of claim 10, wherein at least one of the first or second variable capacitors is a voltage or current tunable capacitor comprising barium strontium titanate.

13. The device of claim 10, wherein the first and second variable capacitors comprise an array of tunable switched capacitors adapted to have non-uniform quality (Q) factors.

14. The device of claim 13, wherein the array of tunable switched capacitors comprises a plurality of fixed capacitors coupled to a plurality of switches.

15. The device of claim 14, wherein at least one of the plurality of switches comprises one of a plurality of semiconductor switches or a plurality of micro-electro-mechanical systems (MEMS) switches.

16. The device of claim 15, wherein the plurality of switches are scaled to reduce a size of the single die thereby providing the non-uniform Q factors in the array of tunable switched capacitors.

17. A device, comprising:
    first and second variable capacitors on a single die, wherein the first and second variable capacitors are not in parallel, wherein each end of the first and second variable capacitors has an accessible external port,
    wherein the first and second variable capacitors are adapted to be configured as an L circuit topology.

18. The device of claim 17, wherein at least one of the first or second variable capacitors is a voltage or current tunable capacitor comprising barium strontium titanate.

19. The device of claim 17, comprising a switching system that includes a group of switches, wherein the switching system is coupled with the first and second variable capacitors to enable adjustment between a plurality of topologies according to switch positions of the group of switches, wherein the plurality of topologies includes the L circuit topology.

20. The device of claim 17, wherein the first and second variable capacitors comprise an array of tunable switched capacitors adapted to have non-uniform quality (Q) factors.

* * * * *